US012094917B2

(12) United States Patent
Kim et al.

(10) Patent No.: US 12,094,917 B2
(45) Date of Patent: Sep. 17, 2024

(54) UNIT OF LIGHT-EMITTING ELEMENTS AND DISPLAY DEVICE INCLUDING THE SAME

(71) Applicant: Samsung Display Co., Ltd., Yongin-si (KR)

(72) Inventors: Tae Gyun Kim, Hwaseong-si (KR); Jun Hong Park, Suwon-si (KR); Ki Beom Lee, Seoul (KR); Eui Suk Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 256 days.

(21) Appl. No.: 17/444,742

(22) Filed: Aug. 9, 2021

(65) Prior Publication Data

US 2022/0130895 A1 Apr. 28, 2022

(30) Foreign Application Priority Data

Oct. 28, 2020 (KR) .................. 10-2020-0140881

(51) Int. Cl.
*H01L 27/15* (2006.01)
*H01L 33/24* (2010.01)
*H01L 33/54* (2010.01)

(52) U.S. Cl.
CPC ............ *H01L 27/156* (2013.01); *H01L 33/24* (2013.01); *H01L 33/54* (2013.01)

(58) Field of Classification Search
CPC ............... H01L 27/124; H01L 27/1244; H01L 27/0753; H01L 27/156; H01L 33/38–387; H01L 33/24; H01L 33/54; H01L 33/501; H01L 33/08; G09G 2300/0809–0871
See application file for complete search history.

(56) References Cited

U.S. PATENT DOCUMENTS

2021/0202452 A1  7/2021 Kim et al.

FOREIGN PATENT DOCUMENTS

| KR | 10-2012-0122160 A | 11/2012 | |
| KR | 20120122160 A * | 11/2012 | ............ H01L 33/20 |
| KR | 10-1496151 B1 | 2/2015 | |
| KR | 10-1837623 B1 | 3/2018 | |
| WO | WO-2012148234 A2 * | 11/2012 | ......... H01L 25/0753 |
| WO | WO-2016080710 A1 * | 5/2016 | ........... B82B 3/0066 |

\* cited by examiner

*Primary Examiner* — Walter H Swanson
*Assistant Examiner* — Jacob T Nelson
(74) *Attorney, Agent, or Firm* — Lewis Roca Rothgerber Christie LLP

(57) ABSTRACT

A unit of light-emitting elements includes: a plurality of light-emitting elements; and a binder extending around a periphery of the light-emitting elements and fixing the light-emitting elements. Each of the light-emitting elements includes: first and second semiconductor layers; and an active layer therebetween. A first semiconductor layer, an active layer, and a second semiconductor layer of a first light-emitting element are arranged along a first direction in this order, and a second semiconductor layer, an active layer, and a first semiconductor layer of a second light-emitting element are arranged along the first direction in this order.

12 Claims, 38 Drawing Sheets

UNIT OF LIGHT-EMITTING ELEMENTS AND DISPLAY DEVICE INCLUDING THE SAME

CROSS-REFERENCE TO RELATED APPLICATION

This application claims priority to and the benefit of Korean Patent Application No. 10-2020-0140881, filed on Oct. 28, 2020, in the Korean Intellectual Property Office, the disclosure of which is incorporated herein by reference in its entirety.

BACKGROUND

1. Field

Aspects of embodiments of the present disclosure relate to a unit of light-emitting elements and a display device including the same.

2. Description of the Related Art

Display devices become more and more important as multimedia technology evolves. Accordingly, a variety of types of display devices, such as organic light-emitting diode (OLED) display devices and liquid-crystal display (LCD) devices, are currently used.

Display devices display images and include a display panel, such as an organic light-emitting display panel or a liquid-crystal display panel. A light-emitting display panel may include light-emitting elements, such as light-emitting diodes (LEDs). Light-emitting diodes may include an organic light-emitting diode (OLED) using an organic material as a luminescent material and an inorganic light-emitting diode using an inorganic material as a luminescent material.

SUMMARY

Embodiments of the present disclosure provide a unit of light-emitting elements including a plurality of light-emitting elements in which semiconductor layers are stacked in different directions and a binder for fixing them. Other embodiments of the present disclosure provide a display device including the unit of light-emitting elements so that a plurality of light-emitting elements is aligned in a direction perpendicular to electrodes.

However, aspects and features of the present disclosure are not limited to those mentioned above, and other aspects and features of the present disclosure will be apparent to those skilled in the art from the following descriptions.

According to an embodiment of the present disclosure, a unit of light-emitting elements, the unit including: a plurality of light-emitting elements having a shape extended in a first direction and arranged and spaced apart from one another in a second direction perpendicular to the first direction; and a binder extending around a periphery the plurality of light-emitting elements and fixing the plurality of light-emitting elements. Each of the plurality of light-emitting elements includes a first semiconductor layer, a second semiconductor layer, and an active layer between the first semiconductor layer and the second semiconductor layer. The plurality of light-emitting elements includes a first light-emitting element and a second light-emitting element. A first semiconductor layer of the first light-emitting element, an active layer of the first light-emitting element, and a second semiconductor layer of the first light-emitting element are arranged along the first direction in this order, and a second semiconductor layer of the second light-emitting element, an active layer of the second light-emitting element, and a first semiconductor layer of the second light-emitting element are arranged along the first direction in this order.

In an embodiment, the first light-emitting element and the second light-emitting element may be alternately arranged along the second direction.

In an embodiment, a thickness of the binder in the first direction may be smaller than a length of the light-emitting elements in the first direction.

In an embodiment, each of the light-emitting elements may have a first end on one side of the first direction and a second end on an opposite side of the first direction, and the binder may expose the first end and the second end of each of the light-emitting elements.

In an embodiment, the second semiconductor layer of the first light-emitting element may be at a first end of the first light-emitting element, the first semiconductor layer of the first light-emitting element may be at a second end of the first light-emitting element, the first semiconductor layer of the second light-emitting element may be at a first end of the second light-emitting element, and the second semiconductor layer of the second light-emitting element may be at a second end of the second light-emitting element.

In an embodiment, the binder may expose at least one of both ends of each of the light-emitting elements.

In an embodiment, the binder may extend around a part of a periphery of outer surfaces of the light-emitting elements and may extend around an entire periphery of an outer surface of the active layer.

According to another embodiment of the present disclosure, a display device includes: a substrate; a first electrode on the substrate; a second electrode above the first electrode and spaced apart from the first electrode in a thickness direction of the substrate; and a unit of light-emitting elements between the first electrode and the second electrode. The unit of light-emitting elements includes: a plurality of light-emitting elements having a shape extended in a first direction and spaced apart from one another in a second direction perpendicular to the first direction; and a binder extending around a periphery of the plurality of light-emitting elements and fixing the plurality of light-emitting elements. Each of the plurality of light-emitting elements includes a first semiconductor layer, a second semiconductor layer, and an active layer between the first semiconductor layer and the second semiconductor layer. The plurality of light-emitting elements includes: a first light-emitting element in which the first semiconductor layer, the active layer, and the second semiconductor layer are arranged along the first direction in this order, and a second light-emitting element in which the second semiconductor layer, the active layer, and the first semiconductor layer are arranged along the first direction in this order.

In an embodiment, the first direction and the thickness direction of the substrate may be parallel to each other.

In an embodiment, each of the light-emitting elements may have a first end electrically connected to the first electrode and a second end electrically connected to the second electrode.

In an embodiment, the first end of each of the light-emitting elements may be at a lower end thereof along the first direction, and the second end of each of the light-emitting elements may be at an upper end thereof along the first direction.

In an embodiment, the first end of each of the light-emitting elements may contact the first electrode, and the second end of each of the light-emitting elements may contact the second electrode.

In an embodiment, the display device may include a first insulating layer extending around at least one area of a periphery of the unit of light-emitting elements and on the first electrode. The second electrode may be on the first insulating layer.

In an embodiment, the first insulating layer may expose the second end of each of the light-emitting elements.

In an embodiment, a thickness of the binder in the first direction may be smaller than a length of the light-emitting elements in the first direction.

In an embodiment, the first light-emitting element and the second light-emitting element may be alternately arranged along the second direction.

In an embodiment, the second electrode may overlap the first electrode in the thickness direction of the substrate.

In an embodiment, the unit of light-emitting elements may include a first unit of light-emitting elements and a second unit of light-emitting elements spaced apart from the first unit of light-emitting elements. A plurality of light-emitting elements in the first unit of light-emitting elements may overlap the first electrode, and at least some light-emitting elements from among a plurality of light-emitting elements in the second unit of light-emitting elements may not overlap with the first electrode.

In an embodiment, the second unit of light-emitting elements may include a light-emitting element having at least one of both ends thereof not electrically connected to at least one of the first electrode and the second electrode.

The details of one or more embodiments described in this specification are set forth in the accompanying drawings and the following description.

According to an embodiment of the present disclosure, a unit of light-emitting elements allows a plurality of light-emitting elements fixed by a binder to be arranged between a first electrode and a second electrode without a process of applying an electric field so that one end of the light-emitting elements are oriented in a particular direction. As a result, the efficiency of process of fabricating the display device can be improved.

In addition, the unit of light-emitting elements formed by the fabricating process according to an embodiment of the present disclosure may include the first light-emitting elements and the second light-emitting elements, which have opposite stacking directions, present at a ratio of 5:5. Therefore, the plurality of light-emitting elements included in the unit of light-emitting elements may be arranged so that one end of half of them are orientated in a particular direction while the end of the other half of them are oriented in the opposite direction, even without the process of applying an electric field so that the one ends of the light-emitting elements are oriented at the particular direction as described above. As a result, at least 50% of the light-emitting elements can emit light, and thus, the display quality of the display device can be improved.

Aspects and features of the present disclosure are not limited to those described above, and other aspects and features of the present disclosure will be apparent to those skilled in the art from the following description.

BRIEF DESCRIPTION OF THE DRAWINGS

The above and other aspects and features of the present disclosure will become more apparent by describing, in detail, embodiments thereof with reference to the attached drawings, in which.

DETAILED DESCRIPTION

Figure 1:
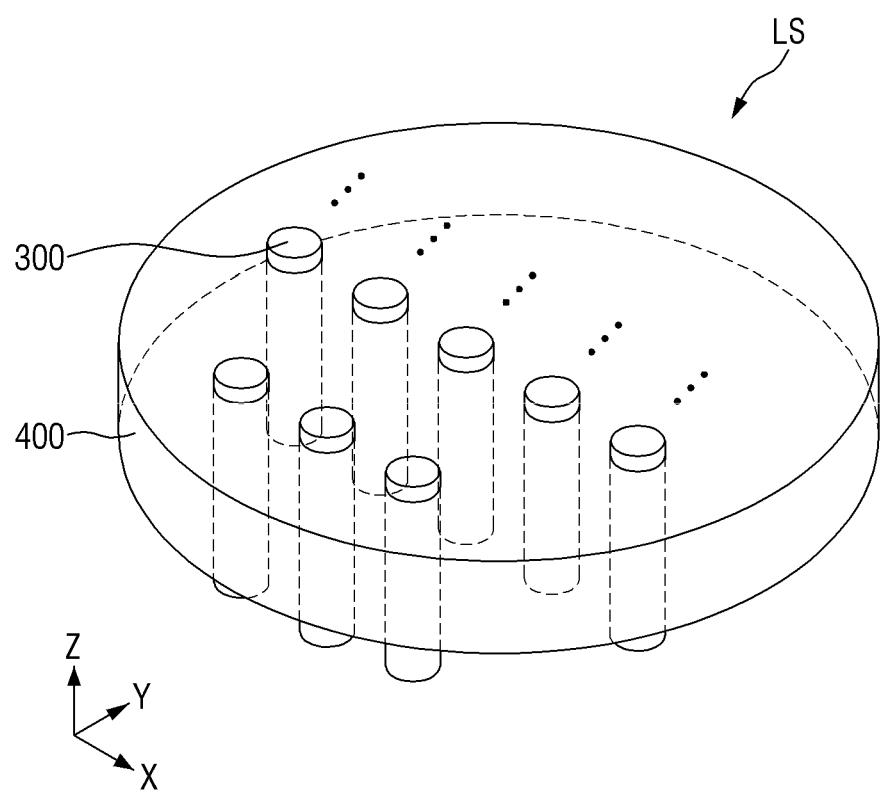
FIG. 1 is a schematic perspective view of a unit of light-emitting elements according to an embodiment of the present disclosure.

The present disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on,"

"directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. It will also be understood that when a layer is referred to as being "on" another layer or substrate, it can be directly on the other layer or substrate, or intervening layers may also be present.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments of the present disclosure will be described with reference to the accompanying drawings.

FIG. 1 is a schematic perspective view of a unit of light-emitting elements according to an embodiment of the present disclosure.

Referring to FIG. 1, a unit of light-emitting elements LS according to an embodiment of the present disclosure includes a plurality of light-emitting elements 300 and a binder 400. The plurality of light-emitting elements 300 has a shape extended in one direction (e.g., the light-emitting elements 300 extend in the one direction), and the binder 400 may surround (e.g., may extend around a periphery of) the plurality of light-emitting elements 300 to fix them.

An x-direction X, a y-direction Y, and a z-direction Z are defined in the drawings. The unit of light-emitting elements LS according to an embodiment will be described with reference to the drawings. The x-direction X may be perpendicular to the y-direction Y in a plane. The z-direction Z may be perpendicular to the plane on which the x-direction X and the y-direction Y are located. The z-direction Z may be perpendicular to each of the x-direction X and the y-direction Y.

In the following description of the unit of light-emitting elements LS according to the embodiments, "top" refers to one side of the z-direction Z, and "upper surface" refers to a surface facing the side of the z-direction Z, unless otherwise stated. In addition, the "bottom" refers to the opposite side of the z-direction Z, and the "lower surface" refers to a surface facing the opposite side of the z-direction Z. As used herein, the terms "left," "right," "upper" and "lower" sides refer to relative positions when the unit of light-emitting elements LS is viewed from the top. For example, "right side" refers to on one side in the x-direction X, "left side" refers to the opposite side in the x-direction X, "upper side" refers to on one side in the y-direction Y, and "lower side" refers to the opposite side in the y-direction Y.

The light-emitting elements 300 are particulate elements and may have a rod-like or cylindrical shape having an aspect ratio (e.g., a predetermined aspect ratio). The light-emitting elements 300 may have a shape extended in one direction. The longitudinal direction of the light-emitting elements 300 may be parallel to the z-direction Z. The length of the light-emitting elements 300 may be larger than the diameter of the light-emitting elements 300, and the aspect ratio may range from, but is not limited to, about 6:5 to about 100:1.

The light-emitting elements 300 may have a size of a nanometer scale (from 1 nm to 1 μm) to a micrometer scale (from 1 μm to 1 mm). According to an embodiment of the present disclosure, both of the diameter and length of the light-emitting elements 300 may have nanometer scales or micrometer scales. In some other embodiments, the diameter of the light-emitting elements 300 may have a nanometer scale, while the length of the light-emitting elements 300 may have a micrometer scale. In some embodiments, the diameter and/or length of some of the light-emitting elements 300 may have nanometer scales, while the diameter and/or length of some others of the light-emitting elements 300 have micrometer scales.

According to an embodiment of the present disclosure, the light-emitting elements 300 may be inorganic light-emitting diodes. The inorganic light-emitting diode may include a plurality of semiconductor layers. For example, the inorganic light-emitting diode may include a first conductivity type (e.g., an n-type) semiconductor layer, a second conductivity type (e.g., a p-type) semiconductor layer, and an active semiconductor layer interposed therebetween. The active semiconductor layer may receive holes and electrons from the first conductivity type semiconductor layer and the second conductivity type semiconductor layer, respectively, and the holes and electrons reaching the active semiconductor layer may be combined to emit light.

The plurality of light-emitting elements 300 may be spaced apart from one another in the x-direction X and/or the y-direction Y perpendicular to the z-direction Z with a spacing (e.g., a predetermined spacing). Although not limited thereto, the plurality of light-emitting elements 300 may be arranged in a matrix pattern.

The binder 400 may be disposed to surround (e.g., extend around a periphery of) the outer surfaces of the plurality of light-emitting elements 300. The binder 400 may be formed to surround at least a part of each of the outer surfaces of the light-emitting elements 300. The binder 400 may be formed so that the plurality of light-emitting elements 300 is located within the binder 400.

The binder 400 may expose both ends of each of the light-emitting elements 300. For example, the light-emitting elements 300 may penetrate the binder 400 in the z-direction Z so that the both ends, i.e., the upper end and the lower end, protrude from the binder 400.

Figure 2:
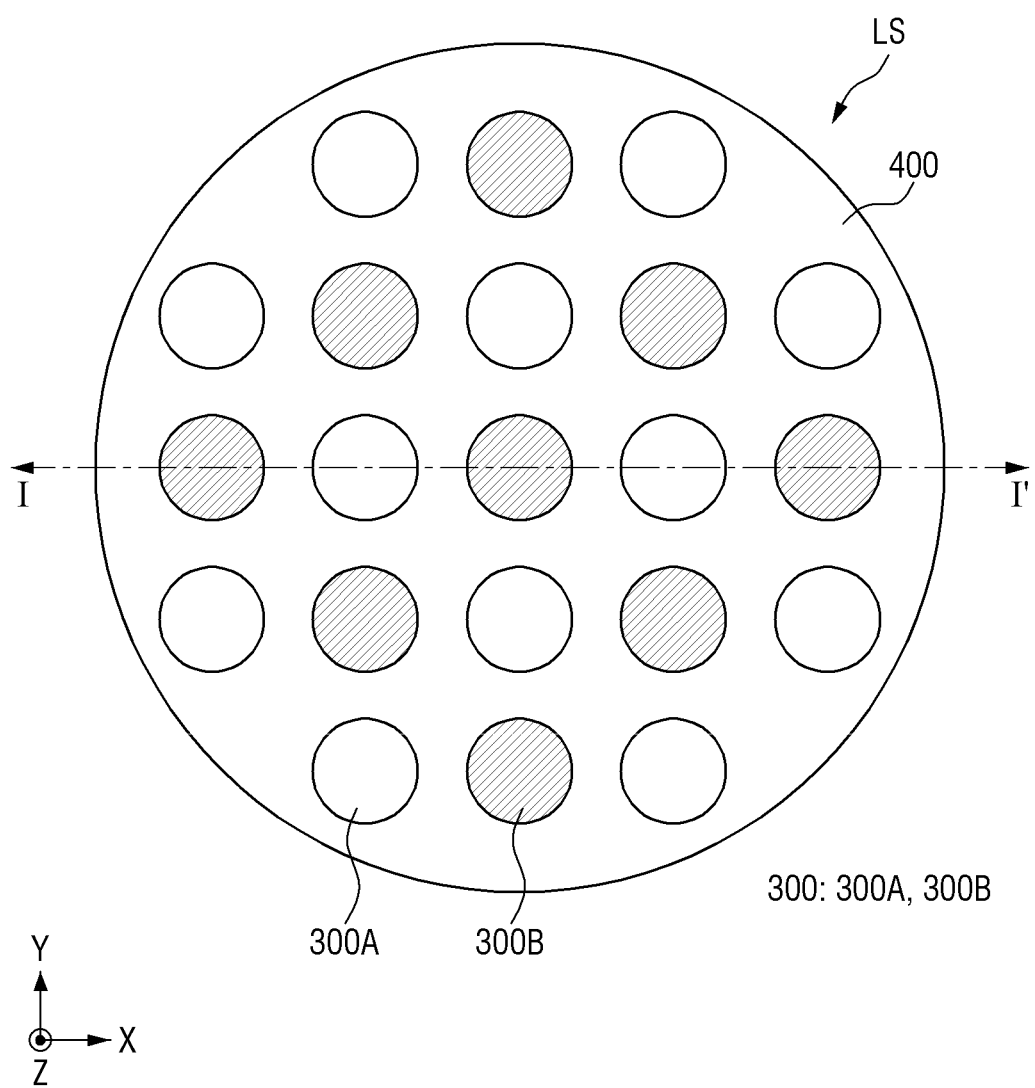
FIG. 2 is a plan view of a unit of light-emitting elements according to an embodiment of the present disclosure.
Figure 3:
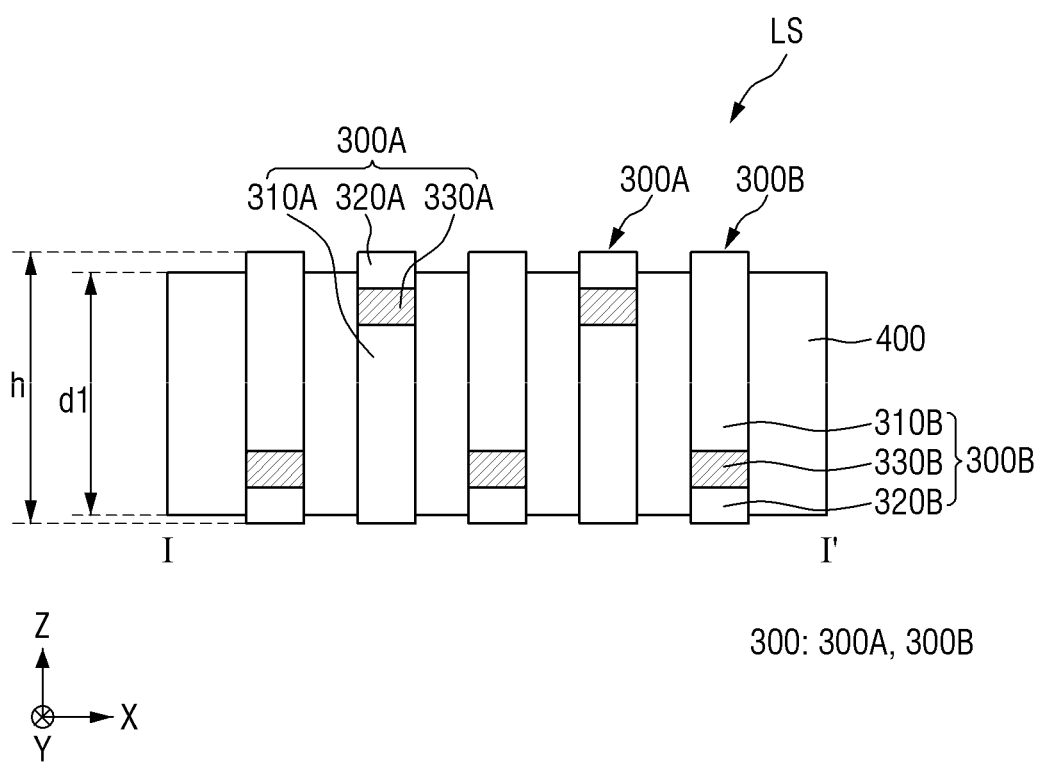
FIG. 3 is a cross-sectional view taken along the line I-I' of FIG. 2.

FIG. 2 is a plan view of a unit of light-emitting elements according to an embodiment of the present disclosure, and FIG. 3 is a cross-sectional view showing an embodiment taken along the line I-I' of FIG. 2.

Referring to FIGS. 2 and 3, each of the plurality of light-emitting elements 300 may include a first semiconductor layer, a second semiconductor layer, and an active layer disposed between the first semiconductor layer and the second semiconductor layer.

The light-emitting elements 300 may include first light-emitting elements 300A and second light-emitting elements 300B that are alternately arranged in the x-direction X and the y-direction Y when viewed from the top.

Each of the first light-emitting elements 300A and the second light-emitting elements 300B may include a first semiconductor layer, a second semiconductor layer, and an active layer disposed between the first semiconductor layer and the second semiconductor layer. The stacking direction of the above-described semiconductor layers and the active layers of the first light-emitting elements 300A may be opposite to the stacking direction of those the second light-emitting elements 300B.

For example, each of the first light-emitting elements 300A may include a first semiconductor layer 310A, a second semiconductor layer 320A, and an active layer 330A disposed between the first semiconductor layer 310A and the second semiconductor layer 320A. In each of the first light-emitting elements 300A, the first semiconductor layer 310A, the active layer 330A, and the second semiconductor layer 320A may be stacked on one another in this order in the longitudinal direction of the first light-emitting elements 300A. For example, the first semiconductor layer 310A, the active layer 330A, and the second semiconductor layer 320A of the first light-emitting element 300A may be stacked on one another in this order in the z-direction Z. Each of the first semiconductor layer 310A, the active layer 330A, and the second semiconductor layer 320A may be a first conductivity type semiconductor layer, an active semiconductor layer, and a second conductivity type semiconductor layer described above, respectively.

Each of the second light-emitting elements 300B may include a first semiconductor layer 310B, a second semiconductor layer 320B, and an active layer 330B disposed between the first semiconductor layer 310B and the second semiconductor layer 320B. In each of the second light-emitting elements 300B, the first semiconductor layer 310B, the active layer 330B, and the second semiconductor layer 320B may be stacked on one another in this order in the longitudinal direction of the second light-emitting elements 300B. For example, the second semiconductor layer 320B, the active layer 330B, and the first semiconductor layer 310b of the second light-emitting element 300B may be stacked on one another in this order in the z-direction Z. Each of the first semiconductor layer 310B, the active layer 330B, and the second semiconductor layer 320B may be a first conductivity type semiconductor layer, an active semiconductor layer, and a second conductivity type semiconductor layer described above, respectively.

For example, the stacking direction of the plurality of layers of the first light-emitting elements 300A may be opposite to the stacking direction of those of the second light-emitting elements 300B, each of which is included in the unit of light-emitting elements LS according to an embodiment of the present disclosure. Herein, the opposite stacking directions provides that the type of the semiconductor layer of the first light-emitting element 300A is different from that of the second light-emitting element 300B at the upper end (e.g., the end on one side of the z-direction), and the type of the semiconductor layer of the first light-emitting element 300A is different from that of the second light-emitting element 300B at the lower end (e.g., the end on one the opposite side of the z-direction). For example, the second semiconductor layer 320A may be located at the upper end (or the end of one side of the z-direction Z) of the first light-emitting element 300A, and the first semiconductor layer 310A may be located at the lower end (or the end of the opposite side in the z-direction Z) of the first light-emitting element 300A. The first semiconductor layer 310B may be located at the upper end (or the end of the side of the z-direction Z) of the second light-emitting element 300B, and the second semiconductor layer 320B may be located at the lower end (or the end of the opposite side in the z-direction Z) of the second light-emitting element 300B.

The first semiconductor layers 310A and 310B may be doped with a first conductivity type dopant. The first conductivity type dopant may be Si, Ge, Sn, etc. According to an embodiment of the present disclosure, the first semiconductor layers 310A and 310B may be n-GaN doped with n-type Si.

The second semiconductor layers 320A and 320B may be spaced apart from the first semiconductor layers 310A and 310B with the active layers 330A and 330B therebetween, respectively. The second semiconductor layer 320A and 320B may be doped with a second conductivity type dopant, such as Mg, Zn, Ca, Se and Ba. According to an embodiment of the present disclosure, the second semiconductor layers 320A and 320B may be p-GaN doped with p-type Mg.

The active layers 330A and 330B may include a material having a single or multiple quantum well structure. As described above, the active layers 330A and 330B may emit light as electron-hole pairs are generated therein in response to an electrical signal applied through the first semiconductor layers 310A and 310B and the second semiconductor layers 320A and 320B.

In some embodiments, each of the active layers 330A and 330B may have a structure in which a semiconductor material having a large band gap energy and a semiconductor material having a small band gap energy are alternately stacked on one another and may include other Group III to Group V semiconductor materials depending on the wavelength range of the emitted light.

The light emitted from the active layer 330A and 330B may exit not only through the outer surfaces of the light-emitting elements 300A and 300B in the longitudinal direction but also through both side surfaces. For example, the direction in which the light emitted from the active layers 330A and 330B propagates is not limited to one direction.

The binder 400 may surround the side surface of each of the light-emitting elements 300 so that a first end thereof and a second end thereof, which is the opposite end, may be partially exposed. The binder 400 may be disposed to completely surround the outer surface (or side surface) of the active layer 330 of each of the light-emitting elements 300 and may surround at least partially the outer surfaces (or the side surfaces) of the first semiconductor layers 310A and 310B and the second semiconductor layers 320A and 320B. The thickness d1 of the binder 400 in the z-direction Z may be smaller than the length h of the light-emitting elements 300 in the z-direction Z. Because the thickness d1 of the binder 400 in the z-direction Z is smaller than the length h of the light-emitting elements 300 in the z-direction Z, the both ends (e.g., the opposite ends) of the light-emitting elements 300 can be exposed from the binder 400.

In the unit of light-emitting elements LS according to this embodiment, the light-emitting elements 300 are fixed by the binder 400. Therefore, in the process of aligning the light-emitting elements 300 between a first electrode and a second electrode during the process of fabricating the display device 10 to be described later, a process of applying an electric signal to form an electric field in a particular direction between the first electrode and the second electrode, and a process of forming an alignment electrode for applying the electric signal for forming the electric field can be omitted. As a result, the efficiency of the process of fabricating the display device 10 can be improved.

FIGS. 4 to 11 are cross-sectional views showing processing steps of the unit of light-emitting elements shown in FIG. 3.

Figure 4:
FIGS. 4 to 11 are cross-sectional views showing processing steps of the unit of light-emitting elements shown in FIG. 3.
Figure 4:
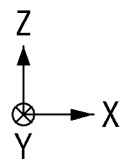

Referring first to FIG. 4, a lower substrate 1000 is prepared.

The lower substrate 1000 may include a base substrate 1100 and a buffer material layer 1200 disposed on the base substrate 1100.

The base substrate 1100 may include a transparent substrate, such as a sapphire substrate ($Al_xO_y$) and a glass substrate. In an embodiment, the base substrate 1100 may be a sapphire substrate ($Al_xO_y$).

A plurality of semiconductor layers included in the light-emitting element 300 described above may be formed on a surface of the base substrate 1100. The plurality of semiconductor layers included in the light-emitting element 300 may be formed by forming a seed crystal on the base substrate 1100 and growing it by an epitaxial-growth technique. The semiconductor layers may be formed by an electron beam deposition method, physical vapor deposition (PVD), chemical vapor deposition (CVD), plasma laser deposition (PLD), dual-type thermal evaporation, sputtering, metal-organic chemical vapor deposition (MOCVD), or metal-organic chemical vapor deposition (MOCVD).

Subsequently, the buffer material layer 1200 may be formed on the surface (or upper surface) of the base substrate 1100. The buffer material layer 1200 can reduce a difference in lattice constants between the base substrate 1100 and the first semiconductor material layer 3100 (see, e.g., FIG. 6) and between the base substrate 1100 and the second lower semiconductor pattern 3200B (see, e.g., FIG. 5). The buffer material layer 1200 may include an undoped semiconductor. The buffer material layer 1200 may include the same material as the first semiconductor material layer 3100 (see, e.g., FIG. 6) and/or the second lower semiconductor pattern 3200B (see, e.g., FIG. 5), which will be described later, and may include a material not doped with a first conductivity type dopant or a second conductivity type dopant (e.g., n-type or p-type). Although the buffer material layer 1200 is shown as a single layer in the drawings, the buffer material layer 1200 may include multiple layers. In an embodiment, the buffer material layer 1200 may include a first layer including an undoped semiconductor and a second layer disposed on the first layer and including a material doped with the first conductivity type dopant.

The buffer material layer 1200 may be omitted depending on the type of the base substrate 1100.

Figure 5:
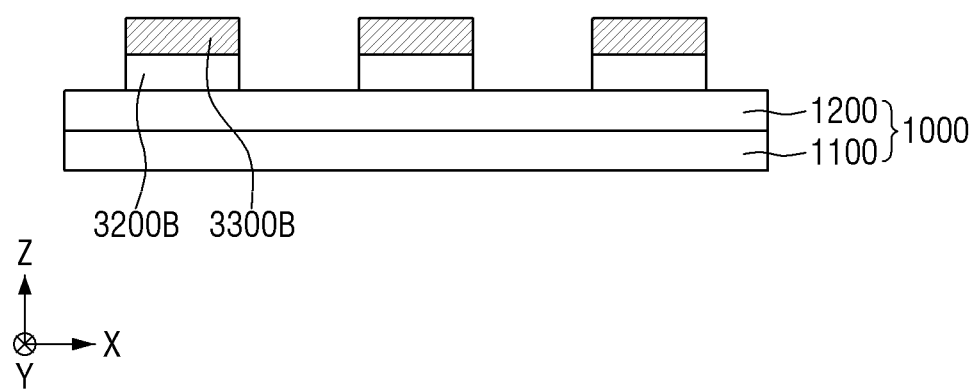

Subsequently, referring to FIG. 5, a second lower semiconductor pattern 3200B and a lower active layer 3300B may be formed on the buffer material layer 1200.

For example, the second lower semiconductor pattern 3200B and the lower active layer 3300B disposed on the second lower semiconductor pattern 3200B may be patterned and formed on the buffer material layer 1200. The second lower semiconductor pattern 3200B and the lower active layer 3300B may be spaced apart from each other. The second lower semiconductor pattern 3200B and the lower active layer 3300B may correspond to the second semiconductor layer 320B and the active layer 330B of the second light-emitting element 300B described above, respectively, and may include the same materials as the respective layers.

The second lower semiconductor pattern 3200B and the lower active layer 3300B may be disposed at a position on the buffer material layer 1200 at where the second light-emitting element 300B is to be formed. The second lower semiconductor pattern 3200B and the lower active layer 3300B may form an island pattern on the lower substrate 1000 when viewed from the top.

The second lower semiconductor pattern 3200B and the lower active layer 3300B may be formed by forming a second lower semiconductor material layer entirely on the buffer material layer 1200, forming a lower active material layer on the second lower semiconductor material layer, and then etching out the second lower semiconductor material layer and the lower active material layer, leaving the position where the second light-emitting element 300B is to be formed. The process of forming the second lower semiconductor material layer and the lower active material layer entirely on the buffer material layer 1200 may be carried out via a known process for forming a semiconductor layer as described above. In addition, the etching process for patterning the second lower semiconductor pattern 3200B and the lower active layer 3300B may be carried out by forming an etch mask layer above the second lower semiconductor material layer and the lower active material layer entirely disposed on the buffer material layer 1200, and performing etching in a direction perpendicular to the lower substrate 1000 along the etch mask layer.

For example, the etching process for patterning the second lower semiconductor pattern 3200B and the lower active layer 3300B may include dry etching, wet etching, reactive ion etching (RIE), inductively-coupled-plasma reactive ion etching (ICP-RIE), etc. The dry etching allows for anisotropic etching, and thus, it may be suitable for vertical etching. When any of the above-described etching methods is used, the etching etchant may be $Cl_2$ or $O_2$. It is, however, to be understood that the present disclosure is not limited thereto.

In some embodiments, an etching process for patterning the second lower semiconductor pattern 3200B and the lower active layer 3300B may be performed by a combination of dry etching and wet etching. For example, dry etching may be carried out first for etching in the depth direction, and then wet etching may be carried out, which is isotropic etching, so that the etched sidewalls are placed in the plane perpendicular to the surface.

Figure 6:
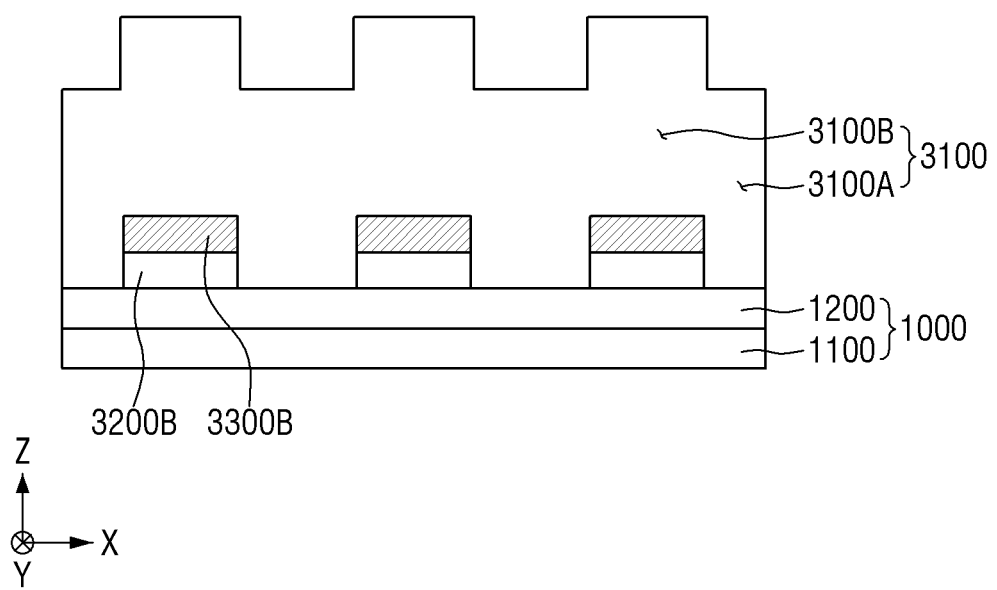

Subsequently, referring to FIG. 6, the first semiconductor material layer 3100 is formed over the lower active layer 3300B.

For example, the first semiconductor material layer 3100 may be entirely formed on the buffer material layer 1200. The upper surface of the first semiconductor material layer 3100 may have a level difference (e.g., a step height difference) by reflecting a level difference of the second lower semiconductor pattern 3200B and the lower active layer 3300B disposed thereunder.

The first semiconductor material layer 3100 may include a first area 3100B overlapping with the second lower semiconductor pattern 3200B and the lower active layer 3300B, and a second area 3100A overlapping neither with the second lower semiconductor pattern 3200B nor with the lower active layer 3300B (e.g., offset from the second lower semiconductor pattern 3200B and the lower active layer 3300B).

The first area 3100B of the first semiconductor material layer 3100 may be grown from the lower active layer 3300B. The first area 3100b of the first semiconductor material layer 3100 may correspond to the first semiconductor layer 310B of the second light-emitting element 300B.

The second area 3100A of the first semiconductor material layer 3100 may be grown from the made of buffer material layer 1200. The second area 3100A of the first semiconductor material layer 3100 may correspond to the first semiconductor layer 310A of the first light-emitting element 300A.

The process of forming the first semiconductor material layer 3100 entirely on the buffer material layer 1200 exposed by the lower active layer 3300B and the lower active layer 3300B may be carried out via a known process for forming a semiconductor layer as described above.

Figure 7:
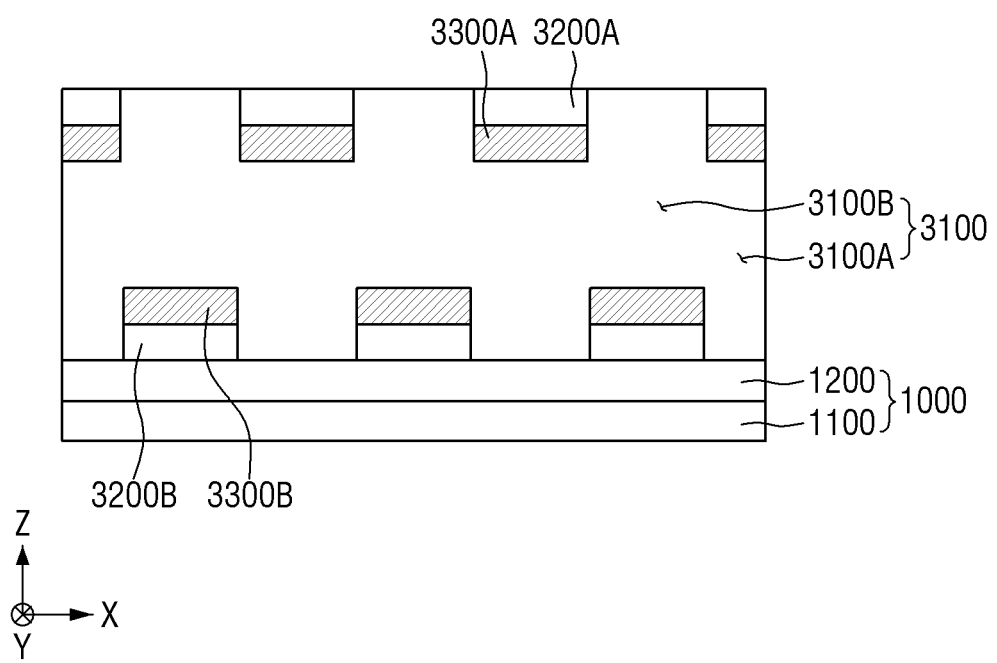

Subsequently, referring to FIG. 7, an upper active layer 3300A and a second upper semiconductor pattern 3200A are formed on the second area 3100A of the first semiconductor material layer 3100.

For example, the upper active layer 3300A and the second upper semiconductor pattern 3200A may be patterned and formed on the second area 3100A of the first semiconductor material layer 3100. The upper active layer 3300A and the second upper semiconductor pattern 3200A may overlap with the second area 3100A of the first semiconductor material layer 3100 in the z-direction Z. The upper active layer 3300A and the second upper semiconductor pattern 3200A may be sequentially stacked in a groove formed by the level difference of the first semiconductor material layer 3100.

The second upper semiconductor pattern 3200A and the upper active layer 3300A may correspond to the second semiconductor layer 320A and the active layer 330A of the first light-emitting element 300A described above, respectively, and may include the same materials as the respective layers.

The upper active layer 3300A and the second upper semiconductor pattern 3200A may be formed by forming an upper active material layer entirely on the first semiconductor material layer 3100, forming a second upper semiconductor material layer on the upper active material layer, and then etching out the upper active material layer and the second upper semiconductor material layer, leaving the position where the first light-emitting element 300A is to be formed. The position where the first light-emitting element 300A is to be formed may be the region except the groove formed by the level difference of the first semiconductor material layer 3100.

The process of forming the upper active material layer and the second upper semiconductor material layer entirely on the first semiconductor material layer 3100 may be carried out via a known process for forming the semiconductor layer as described above. In addition, the etching process for patterning the second upper semiconductor pattern 3200A and the upper active layer 3300A may be carried out by forming an etch mask layer above the upper active material layer and the second upper semiconductor material layer entirely disposed on the first semiconductor material layer 3100, and performing etching in a direction perpendicular to the lower substrate 1000 along the etch mask layer. The etch mask layer may be formed on the second area 3100A of the first semiconductor material layer 3100.

For example, the etching process for patterning the upper active layer 3300A and the second upper semiconductor pattern 3200A may include dry etching, wet etching, reactive ion etching (RIE), inductively-coupled-plasma reactive ion etching (ICP-RIE), etc. The dry etching allows for anisotropic etching, and thus, it may be suitable for vertical etching. When any of the above-described etching methods is used, the etching etchant may be $Cl_2$ or $O_2$. It is, however, to be understood that the present disclosure is not limited thereto.

In some embodiments, an etching process for patterning the upper active layer 3300A and the second upper semiconductor pattern 3200A may be performed by a combination of dry etching and wet etching.

Subsequently, referring to FIG. 8, a plurality of etch masks MK may be formed on the first semiconductor material layer and the second upper semiconductor pattern 3200A.

For example, the plurality of etch masks MK may be formed at the positions where the first light-emitting element 300A and the second light-emitting element 300B are to be formed. For example, some of the plurality of etch masks MK may be formed on the first area 3100B of the first semiconductor material layer 3100, and some others of the plurality of etch masks MK may be formed on the second upper semiconductor patterns 3200A. The plurality of etch masks MK may be spaced apart from one another. A photoresist layer may be applied on the first semiconductor material layer 3100 and the second upper semiconductor pattern 3200A and may be patterned by exposing it to light and developing it so that the patterned etch masks MK can be formed, as shown in FIG. 8.

Figure 9:
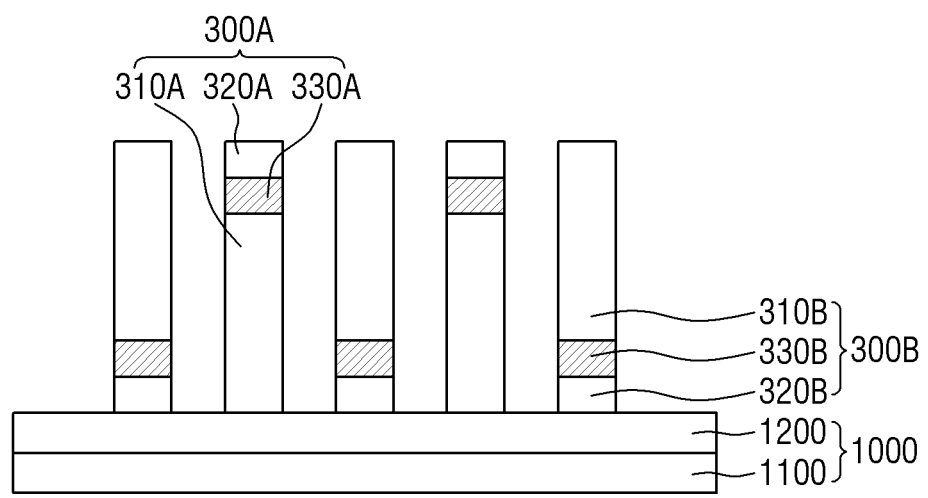

Subsequently, referring to FIG. 9, an etching process is performed using the etch masks MK to form the first light-emitting element 300A and the second light-emitting element 300B, which are spaced apart from each other.

This etching process may be carried out by a known method. For example, the semiconductor stack structure described above may be etched along the etching masks MK in the direction perpendicular to the lower substrate 1000. Through this etching process, the plurality of semiconductor layers disposed in the positions at where the etch masks MK are disposed are not etched out, whereas the plurality of semiconductor layers disposed in the regions where the etch masks MK are not disposed are etched out. As a result, the first light-emitting element 300A and the second light-emitting element 300B spaced apart from each other may be formed, as shown in FIG. 9.

The etching process may include dry etching, wet etching, reactive ion etching (RIE), inductively-coupled-plasma reactive ion etching (ICP-RIE), etc. The dry etching allows for anisotropic etching, and thus, it may be suitable for vertical etching. When any of the above-described etching methods is used, the etching etchant may be $Cl_2$ or $O_2$. It is, however, to be understood that the present disclosure is not limited thereto.

In some embodiments, the etching process may be performed by a combination of dry etching and wet etching. For example, dry etching may be carried out first for etching in the depth direction, and then wet etching may be carried out, which is isotropic etching, so that the etched sidewalls are placed in the plane perpendicular to the surface.

Figure 10:
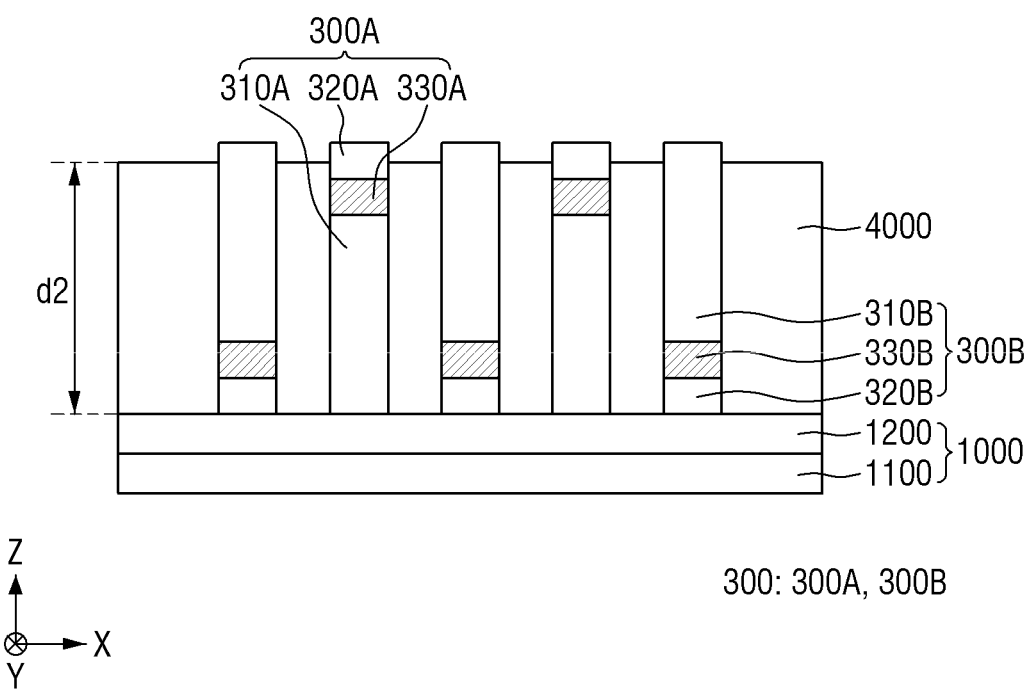

Subsequently, referring to FIG. 10, a binder material layer 4000 surrounding the outer surfaces of the plurality of light-emitting elements 300 is formed.

The binder material layer 4000 may be formed to surround the plurality of light-emitting elements 300. The binder material layer 4000 may be formed to expose the upper ends of the plurality of light-emitting elements 300. For example, the thickness d2 of the binder material layer 4000 in the z-direction may be smaller than the length h of the light-emitting elements 300 in the extending direction. Accordingly, the second semiconductor layer 320A located at the upper end of the first light-emitting element 300A and the first semiconductor layer 310B located at the upper end of the second light-emitting element 300B may be exposed by the binder material layer 4000.

The upper surface of the binder material layer 4000 may be formed to be substantially flat to form a plane parallel to the lower substrate 1000. The lower surface of the binder material layer 4000 may contact the upper surface of the buffer material layer 1200 of the lower substrate 1000.

The binder material layer 4000 may be formed to completely fill the spaces between the plurality of light-emitting elements 300 formed on the lower substrate 1000. The binder material layer 4000 may be formed to completely fill the spaces between the plurality of light-emitting elements 300 to fix them.

The binder material layer 4000 may be formed by applying or ejecting the material for the binder material layer 4000 onto the light-emitting elements 300. According to an embodiment of the present disclosure, the binder material layer 4000 may be formed on the lower substrate 1000 by inkjet printing, spin coating, die-slot coating, a slit coating, or the like. It is, however, to be understood that the present disclosure is not limited thereto.

The binder material layer 4000 may include an insulating material. The insulating material may include an organic insulating material or an inorganic insulating material. Examples of the inorganic insulating material may include an inorganic material including a polymer or nitride-based inorganic material. It may include an inorganic insulating material, such as silicon nitride ($SiN_x$) and aluminum nitride (AlN). In addition, the polymer may be, but is not limited to, a photosensitive polymer, such as poly(methyl methacrylate) (PMMA) and poly(methyl glutarimide) (PMGI). Examples of the organic insulating material may include, but are not limited to, polyimide (PI).

Figure 11:
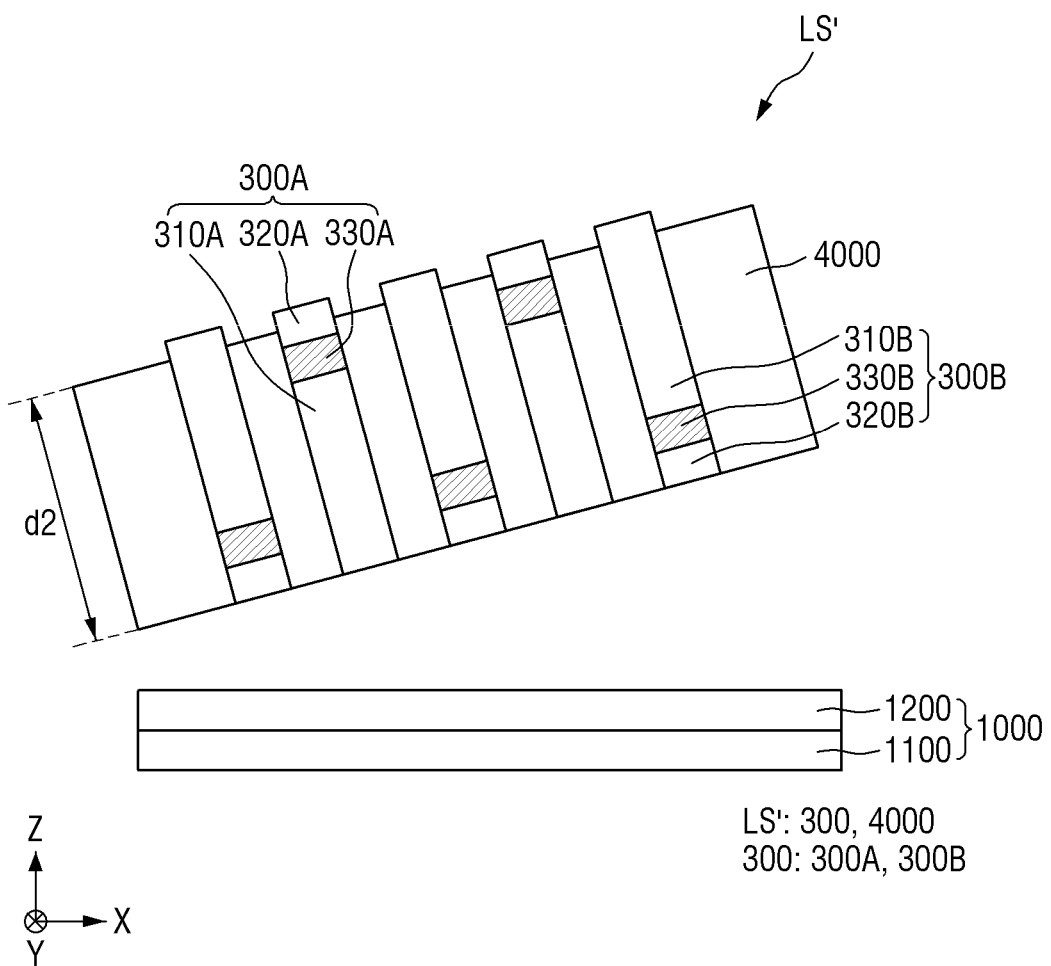

Subsequently, referring to FIG. 11, a light-emitting element structure LS' including the plurality of light-emitting elements 300 and the binder material layer 4000 is separated from the lower substrate 1000.

The process of separating the light-emitting element structure LS' from the lower substrate 1000 is not particularly limited herein. The process of separating the light-emitting element structure LS' from the lower substrate 1000 may be performed by a physical separation method or a chemical separation method. The bottom surface of the light-emitting element structure LS' may include (or may be) the bottom surface of the binder material layer 4000, the bottom surfaces of the first light-emitting elements 300A, and the bottom surfaces of the second light-emitting elements 300B after the separation process. For example, the bottom surface of the binder material layer 4000 may be parallel to the bottom surfaces of the first light-emitting elements 300A and the second light-emitting elements 300B.

Subsequently, the binder material layer 4000 may be cured or deteriorate and, thus, its thickness may be reduced so that the binder 400 shown in FIG. 3 may be formed. Accordingly, the thickness of the binder material layer 4000 is reduced in the z-direction Z so that the lower ends of the first light-emitting elements 300A and the second light-emitting elements 300B may be exposed from the binder 400 as shown in FIG. 3.

In the process of fabricating the unit of light-emitting elements LS according to this embodiment, the plurality of light-emitting elements 300 can be separated from the lower substrate 1000 altogether by using the binder 400 including an insulating material without separating the plurality of light-emitting elements 300 from one another. In this manner, it is possible to prevent (or substantially prevent) damage to the semiconductor layer disposed at the lower portion of each of the light-emitting elements 300.

In addition, the unit of light-emitting elements LS formed by the fabricating process according to this embodiment allows the plurality of light-emitting elements 300 fixed by the binder 400 to be disposed between a first electrode and a second electrode during the process of disposing them on the substrate SUB of the display device 10, without a process of applying an electric field so that the first ends of the light-emitting elements 300 are oriented in a particular direction. As a result, the efficiency of process of fabricating the display device 10 described below can be improved.

In addition, the unit of light-emitting elements LS formed by the fabricating process according to this embodiment may include the first light-emitting elements 300A and the second light-emitting elements 300B at a ratio of 5:5, which have the opposite stacking directions. Therefore, the plurality of light-emitting elements 300 included in the unit of light-emitting elements LS can be arranged so that the one ends of half of them are orientated in a particular direction while the one ends of the other half of them are oriented in the opposite direction, even without the process of applying an electric field so that one ends of the light-emitting elements 300 are oriented at the particular direction as described above. As a result, at least 50% of the light-emitting elements 300 can emit light, and thus, the display quality of the display device 10 described below can be improved.

Figure 12:
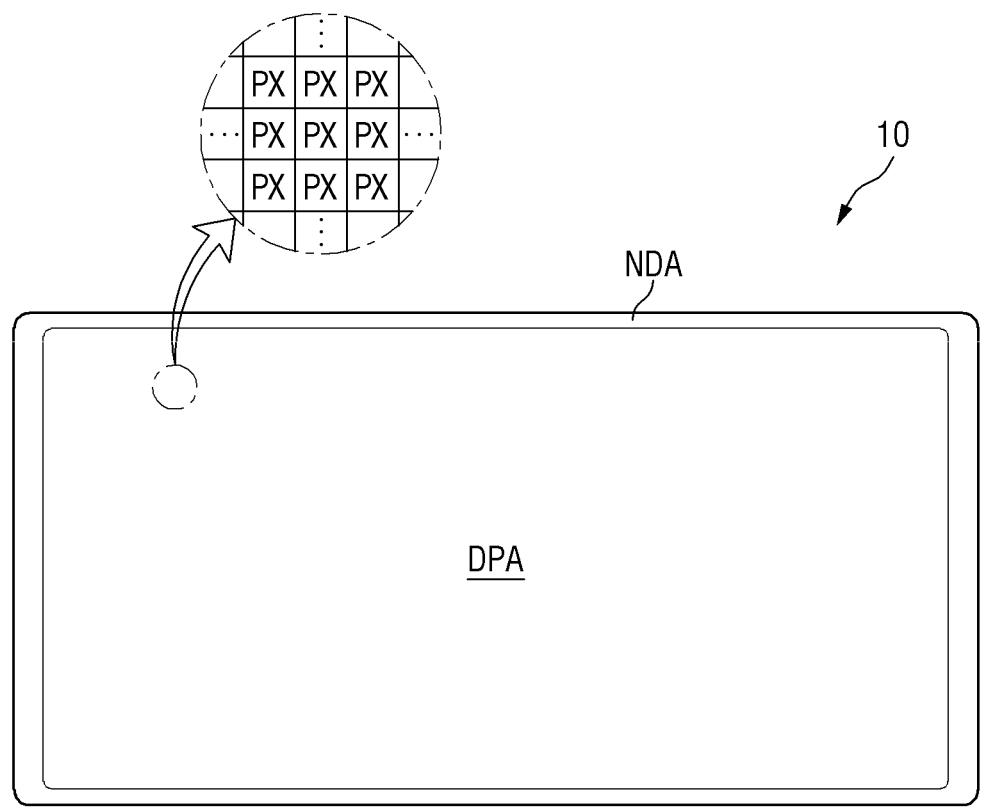
FIG. 12 is a schematic plan view of a display device according to an embodiment of the present disclosure.

FIG. 12 is a schematic plan view of a display device according to an embodiment of the present disclosure.

Referring to FIG. 12, a display device 10 displays (e.g., is configured to display) a moving image or a still image. The display device 10 may refer to any electronic device that provides (or includes) a display screen. For example, the display device 10 may include a television set, a laptop computer, a monitor, an electronic billboard, an Internet of Things (IoT) device, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console, a digital camera, a camcorder, etc.

The display device 10 includes a display panel for providing (or including) a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display device 10, but the present disclosure is not limited thereto. Any other display panel may be employed as long as the technical idea of the present disclosure can be equally applied.

A first direction DR1, a second direction DR2, and a third direction DR3 are defined in the drawings. The display device 10 according to embodiments of the present disclosure will be described with reference to the drawings. The first direction DR1 may be perpendicular to the second direction DR2 in a plane. The third direction DR3 may be perpendicular to the plane on which the first direction DR1 and the second direction DR2 are located. The third direction DR3 may be perpendicular to each of the first direction DR1 and the second direction DR2. In the following description of the display devices 10 according to embodiments of the present disclosure, the third direction DR3 refers to the thickness direction (or the display side) of the display device 10.

The display device 10 may have a rectangular shape including longer sides in the first direction DR1 and shorter sides in the second direction DR2 when viewed from the top. Although the corners where the longer sides and the shorter sides of the display device 10 meet may form a right angle, this is merely illustrative. The display device 10 may have rounded corners. The shape of the display device 10 is not limited to that shown but may be modified in a variety of ways. For example, the display device 10 may have other shapes, such as a square, a rectangle with rounded corners (vertices), other polygons, and a circle.

A display surface may be located on one side of the display device 10 in the third direction DR3 (e.g., the thickness direction). In the following description, the upper side of the display device 10 refers to the side in the third direction DR3 where images are displayed, and the upper surface of the display device 10 refers to the surface facing the side in the third direction DR3, unless specifically stated otherwise.

In addition, the lower side refers to the opposite side in the third direction DR3, and likewise the lower surface refers to the surface facing the opposite side in the third direction DR3. As used herein, the terms "left," "right," "upper," and "lower" sides refer to relative positions when the display device 10 is viewed from the top. For example, the right side refers to one side in the first direction DR1, the left side refers to the opposite side in the first direction DR1, the upper side refers to one side in the second direction DR2, and the lower side refers to the opposite side in the second direction DR2.

The display device 10 may include the display area DA and a non-display area NDA. In the display area DPA, images can be displayed. In the non-display area NDA, images are not displayed.

The shape of the display area DPA may follow the shape of the display device 10. For example, the shape of the display area DPA may have a rectangular shape generally similar to the shape of the display device 10 when viewed from the top. The display area DPA may generally occupy the center of the display device 10.

The display area DPA may include a plurality of pixels PX. The plurality of pixels PX may be arranged in a matrix. The shape of each of the pixels PX may be rectangular or square when viewed from the top. In an embodiment, each of the pixels PX may include a plurality of light-emitting elements made of inorganic particles.

The non-display area NDA may be disposed around the display area DPA. The non-display area NDA may surround (e.g., may extend around a periphery of) the display area DPA, entirely or partially. The non-display area NDA may form the bezel of the display device 10.

Figure 13:
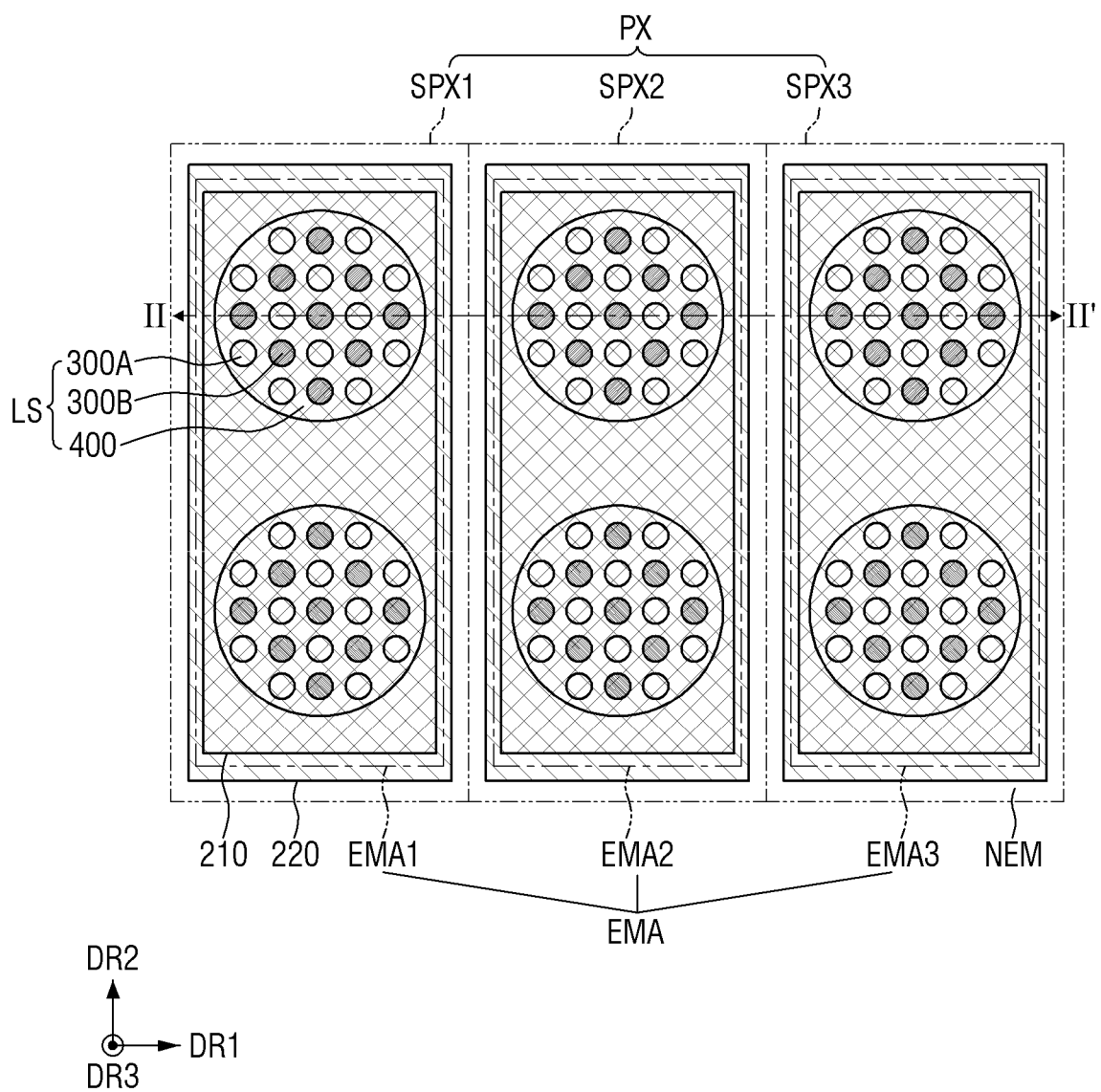
FIG. 13 is a plan view showing a pixel of a display device according to an embodiment of the present disclosure.
Figure 14:
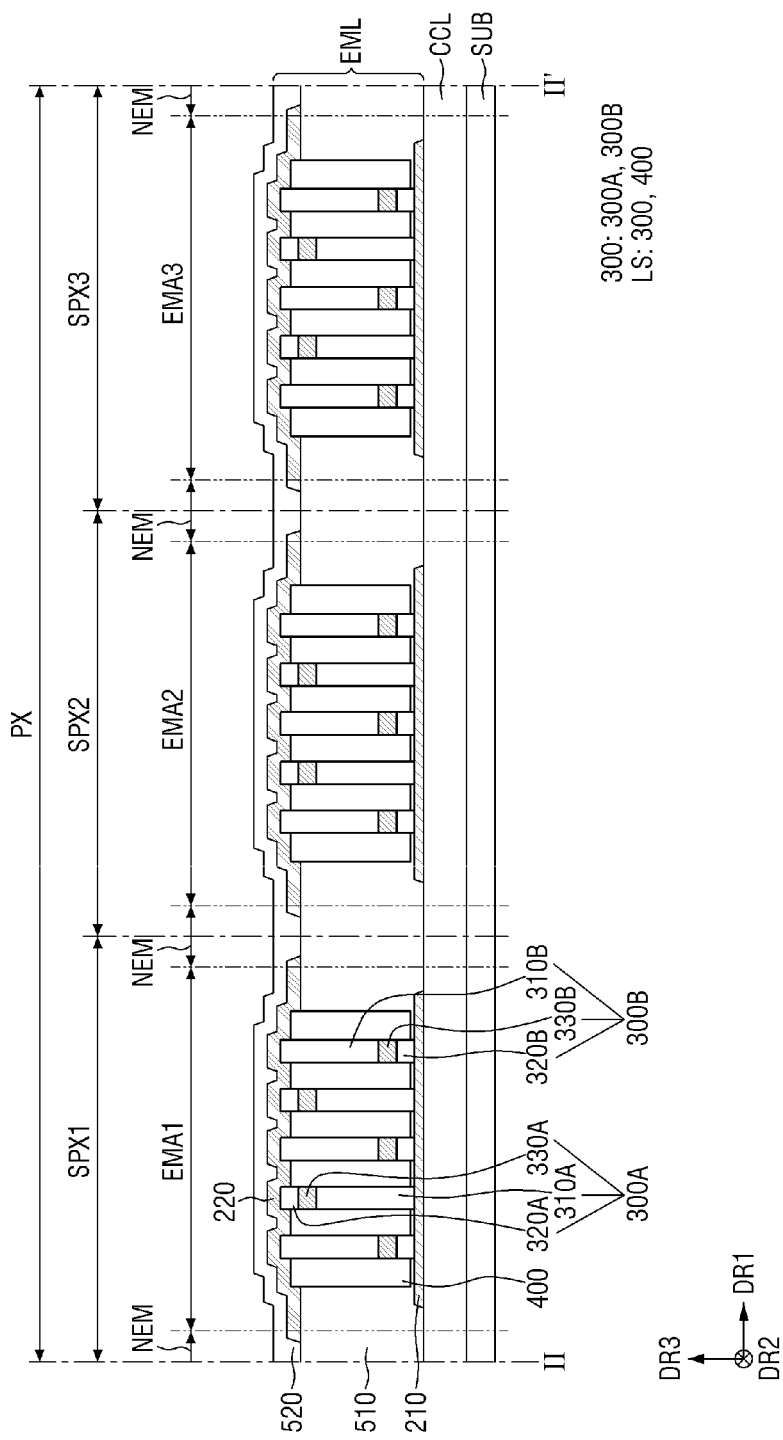
FIG. 14 is a cross-sectional view taken along the line II-II' of FIG. 13.

FIG. 13 is a plan view showing a pixel of a display device according to an embodiment of the present disclosure, and FIG. 14 is a cross-sectional view taken along the line II-II' of FIG. 13.

Referring to FIGS. 13 and 14, each of the pixels PX of the display device 10 may include a plurality of sub-pixels SPX: SPX1, SPX2 and SPX3 to realize full color display. Each of the pixels PX may include a first sub-pixel SPX1 that emits light of a first color, a second sub-pixel SPX2 that emits light of a second color, and a third sub-pixel SPX3 that emits light of a third color. One first sub-pixel SPX1, one second sub-pixel SPX2, and one third sub-pixel SPX3 may be provided for each of the pixels PX. The sub-pixels SPX may be sequentially and repeatedly arranged in the order of the first sub-pixel SPX1, the second sub-pixel SPX2, and the third sub-pixel SPX3 in the first direction DR1. For example, the first color may be red, the second color may be green, and the third color may be blue.

Each of the sub-pixels SPX of the display device 10 may include an emission area EMA: EMA1, EMA2 and EMA3 and a non-emission area NEM. In the emission area EMA, the units of light-emitting elements LS may be disposed and they may output (or emit) light. On the other hand, no light may be output from the non-emission area NEM.

The emission area EMA may include a first emission area EMA1, a second emission area EMA2, and a third emission area EMA3. The first to third emission areas EMA1, EMA2, and EMA3 may be the emission areas EMA of the first to third sub-pixels SPX1, SPX2, and SPX3, respectively. For example, the first emission area EMA1 may be the emission area EMA of the first sub-pixel SPX1, the second emission area EMA2 may be the emission area EMA of the second sub-pixel SPX2, and the third emission area EMA3 may be the emission area EMA of the third sub-pixel SPX3.

The non-emission area NEM may be disposed to surround the plurality of emission areas EMA: EMA1, EMA2 and EMA3. The non-emission area NEM of a sub-pixel SPX meets the non-emission area NEM of an adjacent sub-pixel SPX (regardless of whether the adjacent sub-pixel SPX is in the same pixel PX). The non-emission areas NEM of the adjacent sub-pixels SPX may be connected to each other as one (e.g., may be integral), and further, the non-emission areas NEM of all sub-pixels SPX may be connected to one another as one (e.g., may be integral). It is, however, to be understood that the present disclosure is not limited thereto. The emission areas EMA of the adjacent sub-pixels SPX may be divided by the non-emission areas NEM.

The display device 10 according to an embodiment includes a substrate SUB, a circuit layer CCL, and an emission material layer EML.

The substrate SUB may be an insulating substrate. The substrate SUB may include (or may be made of) an insulating material, such as glass, quartz, and a polymer resin. The substrate SUB may be either a rigid substrate or a flexible substrate that can be bent, folded, or rolled.

The circuit layer CCL may be disposed on a surface of the substrate SUB. The circuit layer CCL may include at least one transistor or the like to drive an emission material layer EML of each pixel PX (or sub-pixel SPX).

The emission material layer EML may be disposed on a surface of the circuit layer CCL. The emission material layer EML may include a first electrode 210, a second electrode 220, the unit of light-emitting elements LS, a first insulating layer 510, and a second insulating layer 520.

The first electrode 210 may be disposed on the circuit layer CCL. The first electrode 210 may be disposed in each sub-pixel SPX. The first electrode 210 may be patterned so that it is disposed in the emission area EMA of each sub-pixel SPX. The first electrode 210 disposed in each sub-pixel SPX may be spaced apart from another one in the first direction DR1 and the second direction DR2. Accordingly, the first electrode 210 may be disposed in an island-like pattern on the front surface of the display device 10 when viewed from the top.

The first electrode 210 may have a rectangular shape including one side extended in the first direction DR1 and another side extended in the second direction DR2 when viewed from the top. It is, however, to be understood that the present disclosure is not limited thereto. The first electrode 210 may have a shape inclined with respect to the first direction DR1 or a circular shape with a curved outer surface.

In addition, the size of the first electrode 210 is not particularly limited, but may vary depending on the area of each sub-pixel SPX of the display device 10. As shown in the drawings, the first electrode 210 may be disposed in the sub-pixel SPX and smaller than the sub-pixel SPX. Accordingly, the first electrode 210 may be spaced apart from the boundary with another adjacent sub-pixel SPX.

The first electrode 210 may be electrically connected to a driving transistor of the circuit layer CCL, to be described later. The first electrodes 210 may be electrically connected to different driving transistors DTR disposed in different sub-pixels SPX and may receive first supply voltage independently from them.

The second electrode 220 may be disposed above the first electrode 210 in each of the sub-pixels SPX. In an embodiment, the second electrode 220 may be patterned so that it is disposed in each of the sub-pixels SPX. The second electrode 220 disposed in each of the sub-pixels SPX may be spaced apart from an adjacent sub-pixel SPX in the first direction DR1 or the second direction DR2. Accordingly, the second electrode 220 may be disposed in an island-like pattern on the front surface of the display device 10 when viewed from the top. It is, however, to be understood that the present disclosure is not limited thereto. The second electrode 220 disposed in a single pixel PX may be disposed across two or more sub-pixels SPX, and the second electrodes 220 disposed in the first to third sub-pixels SPX1, SPX2 and SPX3 may be extended to be connected with one another (e.g., may be integral). More detailed description thereon will be made below with reference to the other drawings.

The second electrode 220 may have an angled shape including one side extended in the first direction DR1 and another side extended in the second direction DR2 when viewed from the top. It is, however, to be understood that the present disclosure is not limited thereto. The second electrode 220 may have a shape inclined with respect to the first direction DR1 or a circular shape with curved outer surface. As shown in the drawings, the second electrode 220 may be disposed in the sub-pixel SPX and smaller than the sub-pixel SPX. Accordingly, the second electrode 220 may be spaced apart from the boundary with another adjacent sub-pixel SPX. Accordingly, the patterned second electrodes 220 may be disposed in the sub-pixels SPX, respectively, and the light-emitting elements 300 disposed in the plurality of sub-pixels SPX included in a single pixel PX may be electrically connected to the respective second electrodes 220 spaced apart from one another.

At least a part of the second electrode 220 may be disposed to overlap the first electrode 210 in the third direction DR3. The second electrode 220 and the first electrode 210 may have different widths or areas. In an embodiment, the second electrode 220 may be formed to have a larger area than the first electrode 210. For example, the width of the second electrode 220 measured in one direction, for example, in the first direction DR1 or the second direction DR2, may be larger than the width of the first electrode 210 measured in the first direction DR1 or the second direction DR2.

The unit of light-emitting elements LS may be disposed in each sub-pixel SPX. The unit of light-emitting elements LS disposed in each sub-pixel SPX may be disposed in the emission area EMA of each sub-pixel SPX. Although the unit of light-emitting elements LS is disposed in the emission area EMA in the embodiment shown in the drawings, the present disclosure is not limited thereto. In some other embodiments, the unit of light-emitting elements LS may be disposed such that it is partially located in the non-emission area NEM. More detailed description thereof will be made below with reference to the other drawings.

Although two units of light-emitting elements LS are arranged in a single column in each sub-pixel SPX in the example shown in the drawings, the present disclosure is not limited thereto. For example, one unit of light-emitting elements LS may be disposed in a single sub-pixel SPX, or three or more units of light-emitting elements LS may be disposed in a single sub-pixel SPX. The two units of light-emitting elements LS disposed in a single sub-pixel SPX may be arranged in one column such that they are not parallel to each other but are staggered randomly (e.g., are randomly offset). In some embodiments, the units of light-emitting elements LS may be arranged in a number of columns.

The unit of light-emitting elements LS may be disposed between the first electrode 210 and the second electrode 220. The unit of light-emitting elements LS may be disposed on the first electrode 210 so that at least a part thereof overlaps the first electrode 210 in the third direction DR3. According to an embodiment of the present disclosure, the unit of light-emitting elements LS may be disposed so that it overlaps the first electrode 210 in the third direction DR3. The unit of light-emitting elements LS may be disposed between the first electrode 210 and the second electrode 220 to be described below.

As described above, the unit of light-emitting elements LS includes the plurality of light-emitting elements 300 and the binder 400. The unit of light-emitting elements 300 may pass through the binder 400 in the third direction DR3, and the binder 400 may fix (e.g., secure) the plurality of light-emitting elements 300.

Each of the light-emitting elements 300 may have a shape extended in the third direction DR3. The plurality of light-emitting elements 300 may be spaced apart from one another in the first direction DR1 and/or the second direction DR2 perpendicular to the third direction DR3. Because the binder 400 fixes the light-emitting elements 300 extended in the third direction DR3, the plurality of light-emitting elements 300 may be arranged parallel to one another.

Both ends (e.g., opposite ends) of each of the plurality of light-emitting elements 300 may be exposed by (or exposed through) the binder 400. The both ends of each of the plurality of light-emitting elements 300 exposed by the binder 400 may include a first end electrically connected to the first electrode 210 and a second end electrically connected to the second electrode 220 According to this embodiment, the first end of each of the plurality of light-emitting elements 300 may be a lower end, and the second end of each of the plurality of light-emitting elements 300 may be an upper end. The first end of each of the plurality of light-emitting elements 300 may directly contact the first electrode 210, and the second end of each of the plurality of light-emitting elements 300 may directly contact the second electrode 220.

A first semiconductor layer 310A may be located at the first end of the first light-emitting element 300A, and a second semiconductor layer 320B may be located at the first end of the second light-emitting element 300B. A second semiconductor layer 320A may be located at the second end of the first light-emitting element 300A, and a first semiconductor layer 310B may be located at the second end of the second light-emitting element 300B. Accordingly, the first semiconductor layer 310A of the first light-emitting element 300A and the second semiconductor layer 320B of the second light-emitting element 300B may be electrically connected to the first electrode 210, and the second semiconductor layer 320A of the first light-emitting element 300A and the first semiconductor layer 310B of the second light-emitting element 300B may be electrically connected to the second electrode 220.

A first insulating layer 510 may be disposed on the circuit layer CCL and the first electrode 210 at where the units of light-emitting elements LS are not disposed. The region between the first electrode 210 and the second electrode 220 in which the units of light-emitting elements LS are not disposed may be filled with the first insulating layer 510.

The first insulating layer 510 may be disposed to surround (e.g., to extend around a periphery of) the binder 400 disposed on the first electrode 210 and the outer surfaces of the light-emitting elements 300 exposed by the binder 400. The outer surfaces of the light-emitting elements 300 and the outer surface of the binder 400 may directly contact the first insulating layer 510.

The first insulating layer 510 may be formed lower than (e.g., may be shorter or thinner than) the height from the circuit layer CCL to the ends of the light-emitting elements 300 so that at least the ends (e.g., the second ends) of the light-emitting elements 300 are exposed. Accordingly, the upper ends (e.g., the second ends) of the light-emitting elements 300 may protrude from the upper surface of the first insulating layer 510 so that the outer surfaces may not directly contact the first insulating layer 510. The outer surface of the protruding portion of the light-emitting element 300 may contact the second electrode 220 disposed on the first insulating layer 510. For example, according to an embodiment of the present disclosure, the thickness of the first insulating layer 510 may be smaller than the sum of the thickness of the first electrode 210 and the height of the light-emitting elements 300. The first insulating layer 510 may include an inorganic insulating material or an organic insulating material.

The second electrode 220 may be disposed on the first insulating layer 510 and may contact at least the upper ends (e.g., the second ends) of the light-emitting elements 300 protruding from the upper surface of the first insulating layer 510. For example, the second electrode 220 may be disposed to surround the upper ends of the light-emitting elements 300. The first electrode 210 may contact the lower ends of the light-emitting elements 300, and the second electrode 220 may contact the upper ends of the light-emitting elements 300. Accordingly, the upper ends of the light-emitting elements 300 may be electrically connected to the second electrode 220.

The second electrode 220 may be electrically connected to a second supply voltage line. The second electrode 220 may receive a second supply voltage applied through the second supply voltage line. The second electrode 220 may be electrically connected to the same second supply voltage line disposed in the plurality of sub-pixels SPX and may receive the same second supply voltage therefrom. In some embodiments, when a single second electrode 220 is disposed across a plurality of sub-pixels SPX, the plurality of sub-pixels SPX may receive the same electric signal applied to the second supply voltage line through the single second electrode 220.

In an embodiment, the first electrode 210 may be disconnected from sub-pixel SPXn to sub-pixel SPXn, while the second electrode 220 may be a common electrode connected across the sub-pixels SPXn.

Each of the electrodes 210 and 220 may include a transparent conductive material. For example, each of the electrodes 210 and 220 may include, but is not limited to, a material, such as indium tin oxide (ITO), indium zinc oxide (IZO), and indium tin zinc oxide (ITZO). The light-emitting element 300 may output light in both end directions and may output light in the third direction DR3 in which the upper surface of the first electrode 210 faces in the drawing. In some embodiments, the first electrode 210 may include a conductive material having high reflectance so that the light that is output from the light-emitting elements 300 and travels toward the upper surface of the first electrode 210 can be reflected. Some of the light emitted from the light-emitting element 300 may transmit the second electrode 220, which includes a transparent material, to exit from each of the sub-pixels PXn. Another portion of the light may be reflected off the first electrode 210, which includes a material having high reflectance, to exit from each of the sub-pixels PXn. According to an embodiment of the present disclosure, the first electrode 210 may include a metal, such as silver (Ag), copper (Cu), and aluminum (Al), as the material having high reflectance.

The plurality of light-emitting elements 300 may be spaced apart from one another on the first electrode 210. The light-emitting elements 300 may be extended along one direction in the same row or column and may be equally spaced apart from one another. In addition, the plurality of light-emitting elements 300 may be spaced apart from one another and may be arranged substantially parallel to one another. Such a structure may be formed by patterning a plurality of light-emitting elements 300 via an etch process so that they are equally spaced apart from one another and using the material included in the binder 400 to fix the light-emitting elements 300 inside the binder 400 during the process of fabricating the unit of light-emitting elements LS.

A second insulating layer 520 may be disposed over the second electrode 220. The second insulating layer 520 may be disposed entirely on the substrate SUB to protect a plurality of elements disposed therebelow.

FIGS. 15 to 21 are plan views and cross-sectional views showing some of the processing steps of fabricating a display device according to an embodiment of the present disclosure.

Figure 15:
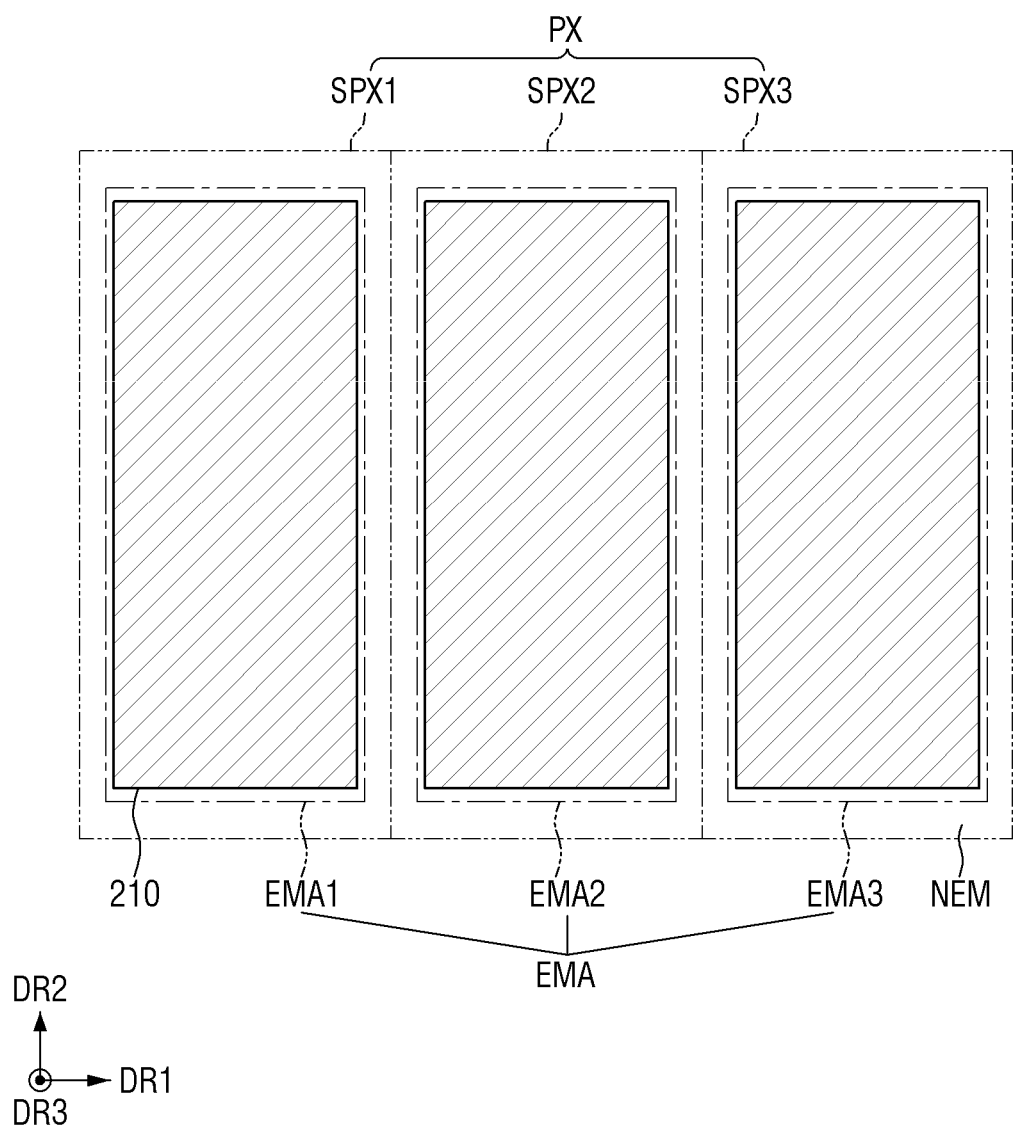
FIGS. 15 to 21 are plan views and cross-sectional views showing processing steps of fabricating a display device according to an embodiment of the present disclosure.
Figure 16:
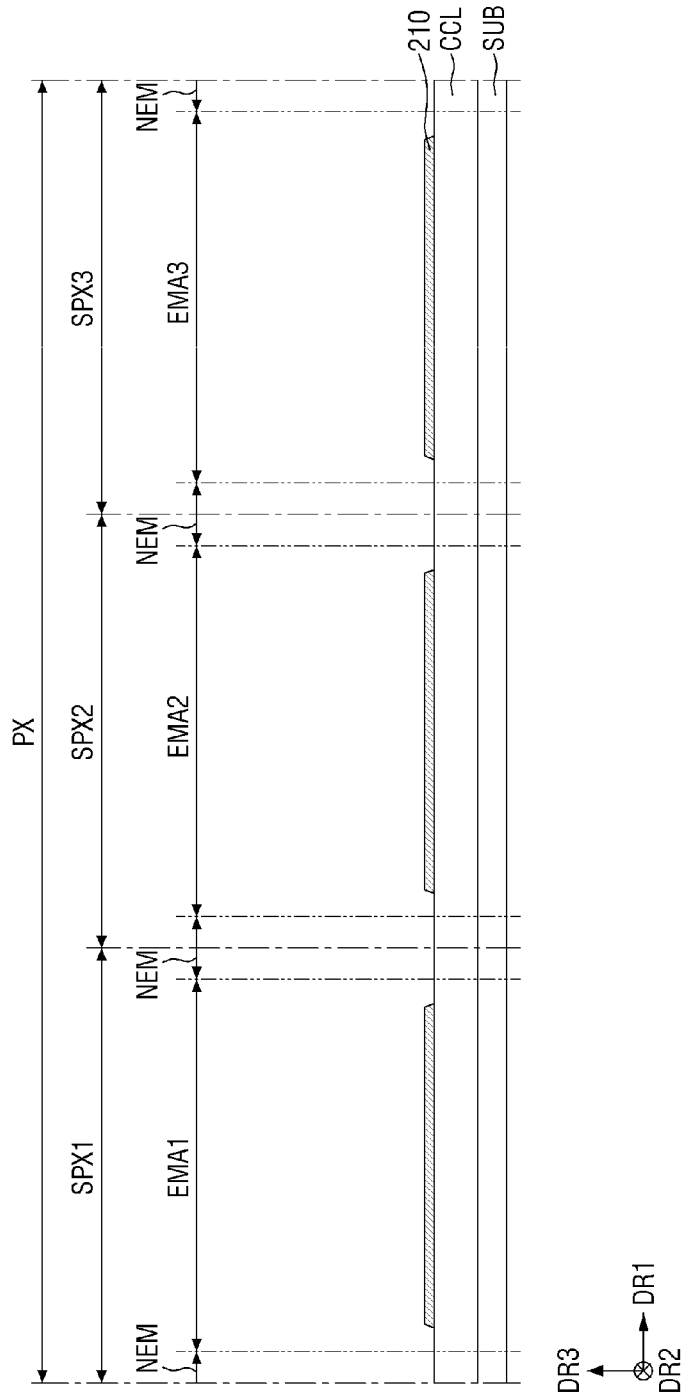

Initially, referring to FIGS. 15 and 16, a substrate SUB and a circuit layer CCL formed on the substrate SUB are prepared. Subsequently, a first electrode 210 is formed on the circuit layer CCL. The first electrode 210 may be disposed in the emission area EMA of each sub-pixel SPX.

Figure 17:
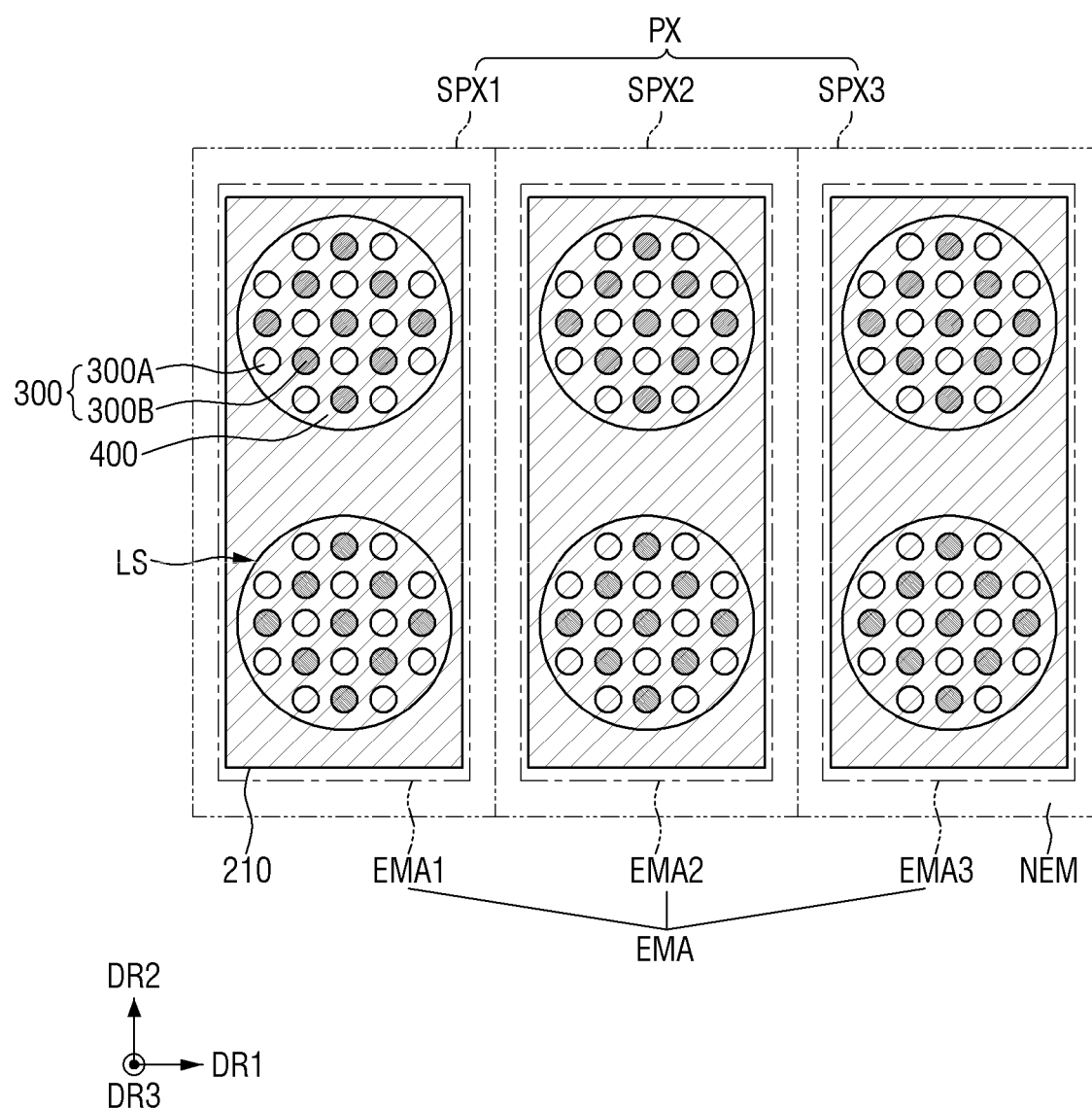
Figure 18:
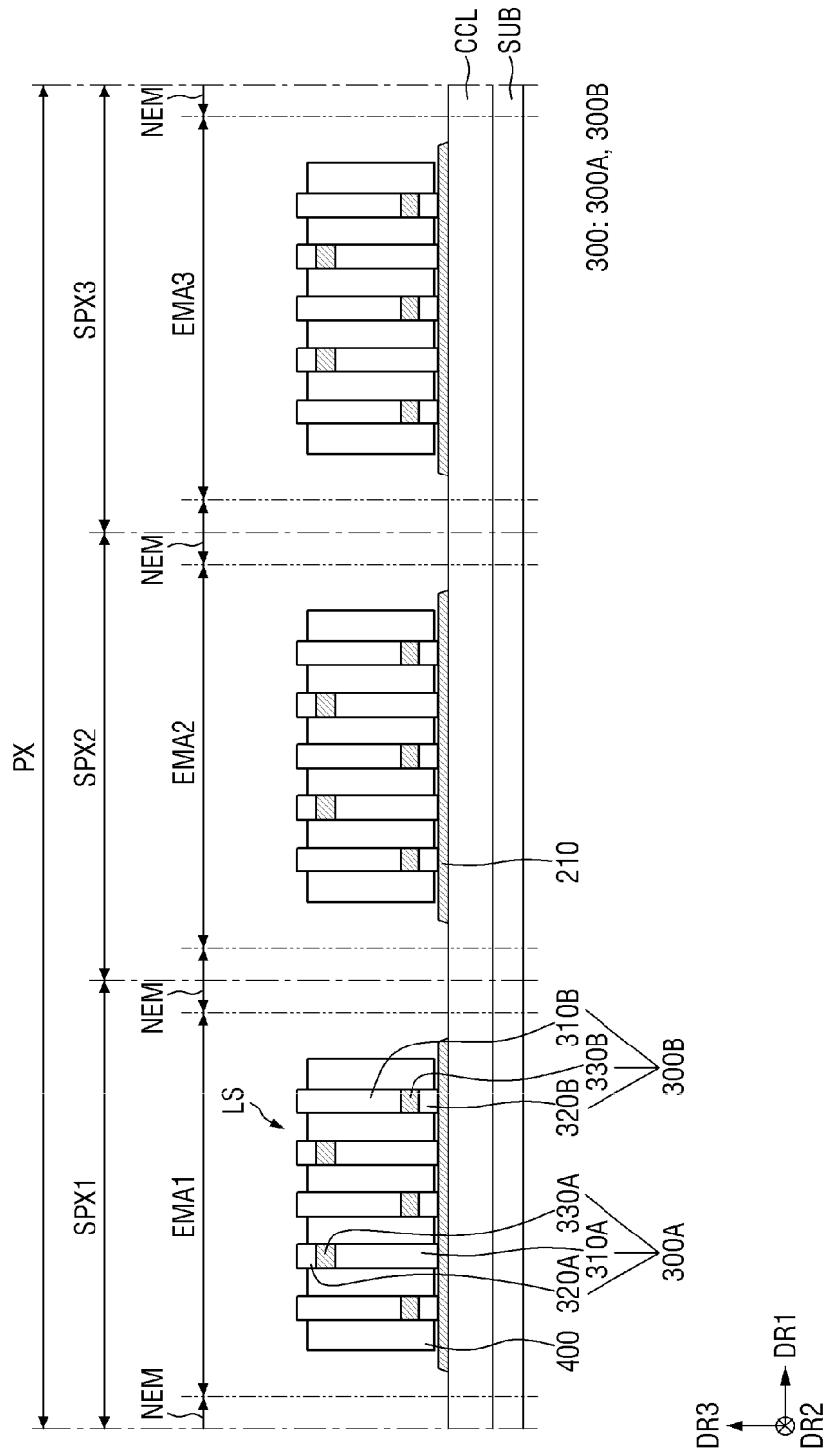

Subsequently, referring to FIGS. 17 and 18, a plurality of units of light-emitting elements LS is disposed on the first electrode 210. The process of disposing the units of the light-emitting elements LS may be carried out by ejecting an ink in which the plurality of units of light-emitting elements LS are dispersed onto the first electrode 210. The process of disposing the plurality of units of light-emitting elements LS on the first electrode 210 may be carried out using only an inkjet process without forming any electric field.

Figure 19:
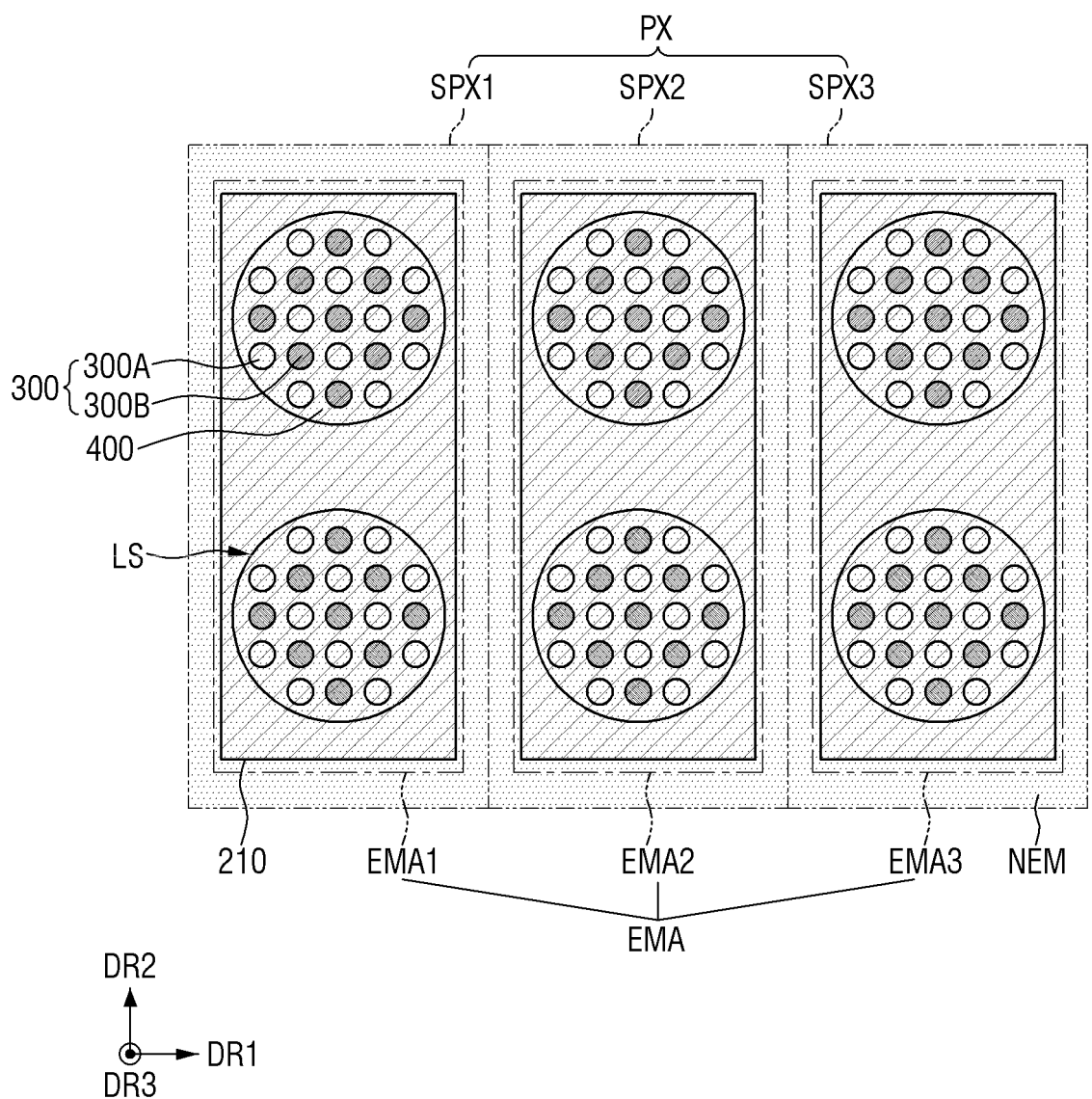
Figure 20:
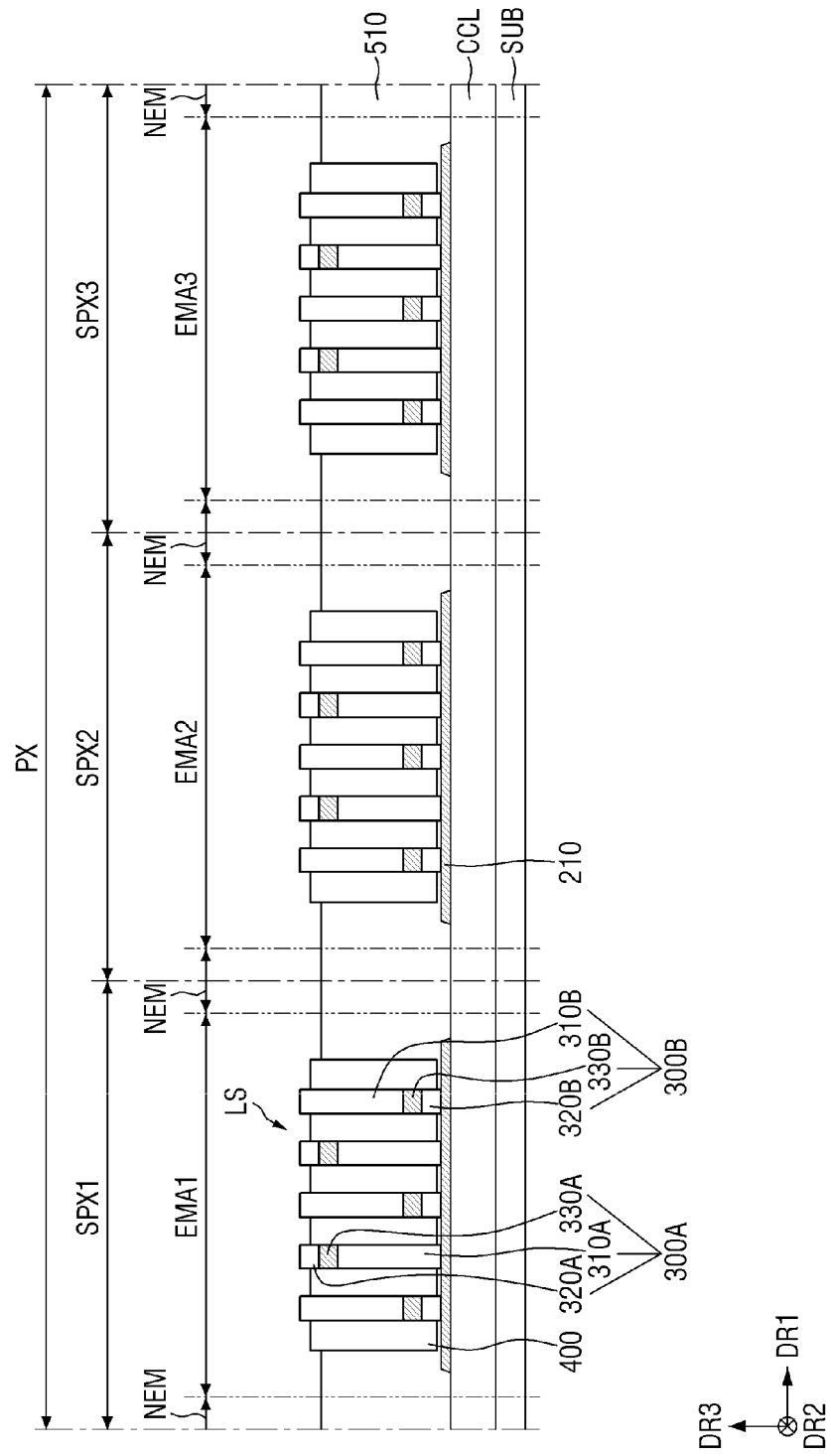

Subsequently, referring to FIGS. 19 and 20, a first insulating layer 510 is formed over the plurality of units of light-emitting elements 300 formed on the substrate SUB. The first insulating layer 510 may be used to fill the space in which the units of light-emitting elements LS are not disposed. The first insulating layer 510 may be formed so that the upper ends of the plurality of light-emitting elements 300 of the unit of light-emitting elements LS are exposed.

Figure 21:
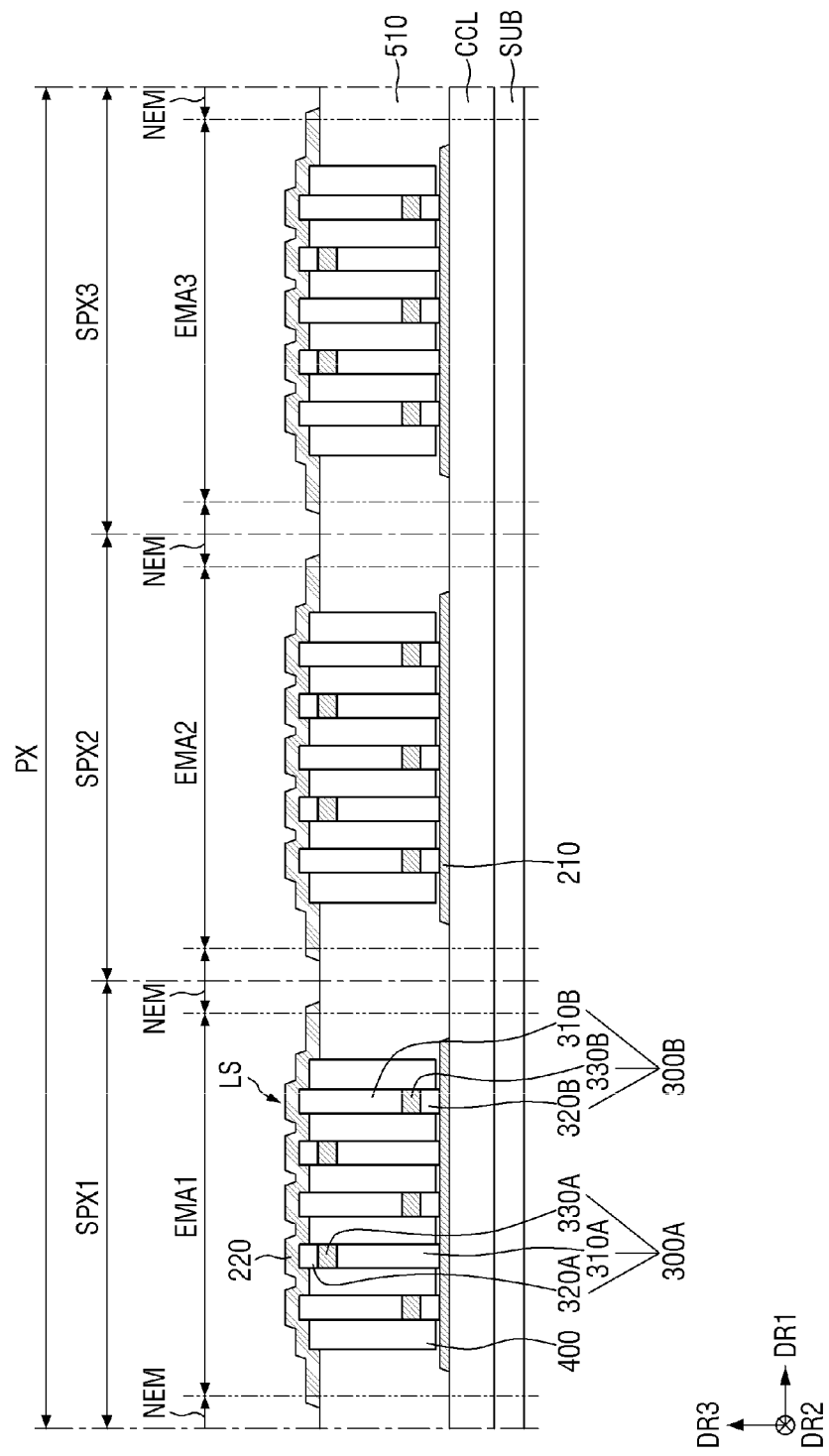

Subsequently, referring to FIG. 21, a second electrode 220 is formed on the first insulating layer 510. The second electrode 220 may be patterned so that it is separately disposed in each sub-pixel SPX. Subsequently, a second insulating layer 520 is formed on the second electrode 220 so that the display device 10 shown in FIG. 14 can be fabricated.

Figure 22:
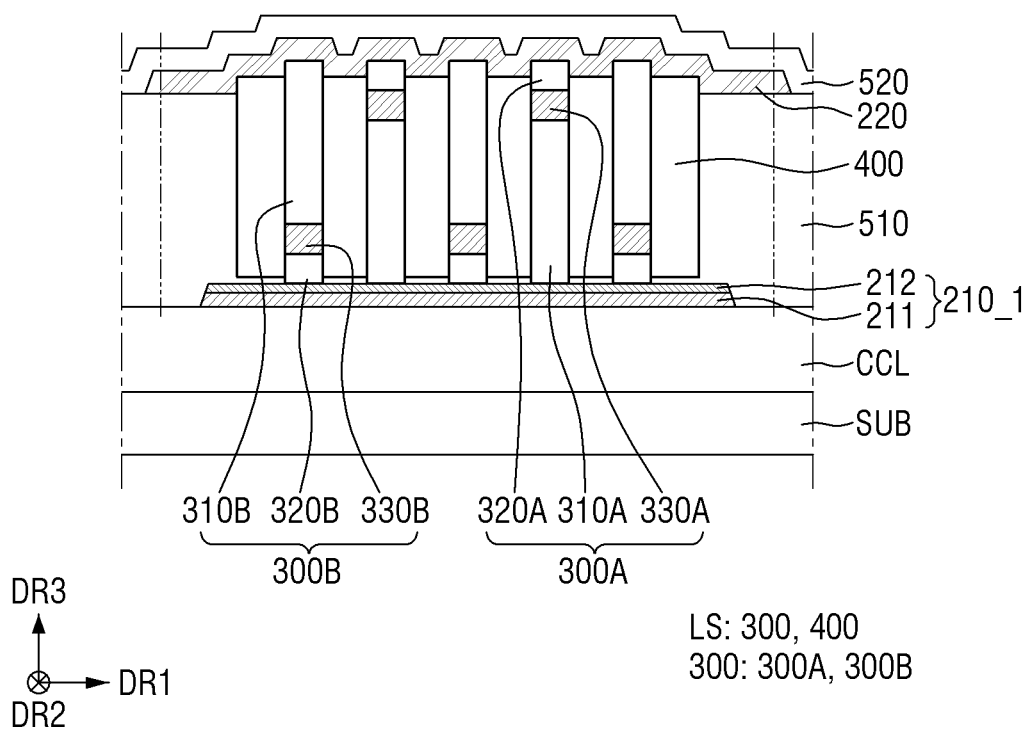
FIG. 22 is an enlarged cross-sectional view showing another embodiment of a sub-pixel of the display device shown in FIG. 14.

FIG. 22 is an enlarged cross-sectional view showing another embodiment of a sub-pixel of the display device shown in FIG. 14.

The display device according to the embodiment shown in FIG. 22 is different from the display device according to the embodiment shown in FIG. 14 in that a first electrode 210_1 is made up of multiple layers.

In the display device 10 according to an embodiment, the first electrode 210_1 may include a plurality of layers. The first electrode 210_1 may include a layer including a transparent material and a layer including a material having high reflectance. Accordingly, at least some of the light that is emitted from the second light-emitting element 300B and is incident on the first electrode 210_1 may be reflected at the upper surface of the layer including the material having the high reflectance from among the plurality of layers of the first electrode 210_1 in the direction that the upper side of the substrate SUB faces (e.g., toward the upper side of the substrate SUB).

The stack structure of the first electrode 210_1 may include a first electrode base layer 211 and a first electrode top layer 212 disposed on the first electrode base layer 211.

The first electrode base layer 211 may be disposed on the circuit layer CCL, and the first electrode top layer 212 may be disposed to cover the upper surface of the first electrode base layer 211. The first electrode base layer 211 and the first electrode top layer 212 may be patterned via a single mask process. In an embodiment, sidewalls of the first electrode base layer 211 may be aligned with the sidewalls of the first electrode top layer 212, respectively.

Both the first electrode base layer 211 and the first electrode top layer 212 may include a conductive material to form the first electrode (e.g., the single first electrode) 210_1. The first electrode base layer 211 may include a conductive material having high reflectance, and the first electrode top layer 212 may include a transparent conductive material. From among the lights emitted from the light-emitting element 300 (e.g., the second light-emitting element 300B), light traveling toward the first electrode 210_1 may transmit the first electrode top layer 212, which includes a transparent material, to proceed to the upper surface of the first electrode base layer 211. At least some of the light incident on the first electrode base layer 211 may be reflected from the upper surface of the first electrode base layer 211 toward the upper side of the substrate SUB. It is, however, to be understood that the present disclosure is not limited thereto. The first electrode top layer 212 may include a conductive material having high reflectance, and among the light emitted from the light-emitting element 300 (e.g., the second light-emitting element 300B), light traveling toward the first electrode 210_1 may be reflected off the upper surface of the first electrode top layer 212 toward the upper side of the substrate SUB.

According to this embodiment, the light that is emitted from the first end of the second light-emitting element 300B closer to the first electrode 210_1 may travel toward the first electrode 210_1. The light that is emitted from the second end of the second light-emitting element 300B closer to the second electrode 220 may transmit the second electrode 220 to exit out of the display device 10, as described above. Therefore, by forming the first electrode base layer 211 to include a reflective material, at least some of the light emitted from the second light-emitting element 300B that travels toward the first electrode 210_1 may be reflected off the upper surface of the first electrode base layer 211 so that it can travel toward the upper side of the substrate SUB. As a result, luminous efficiency of the display device 10 can be improved.

Figure 23:
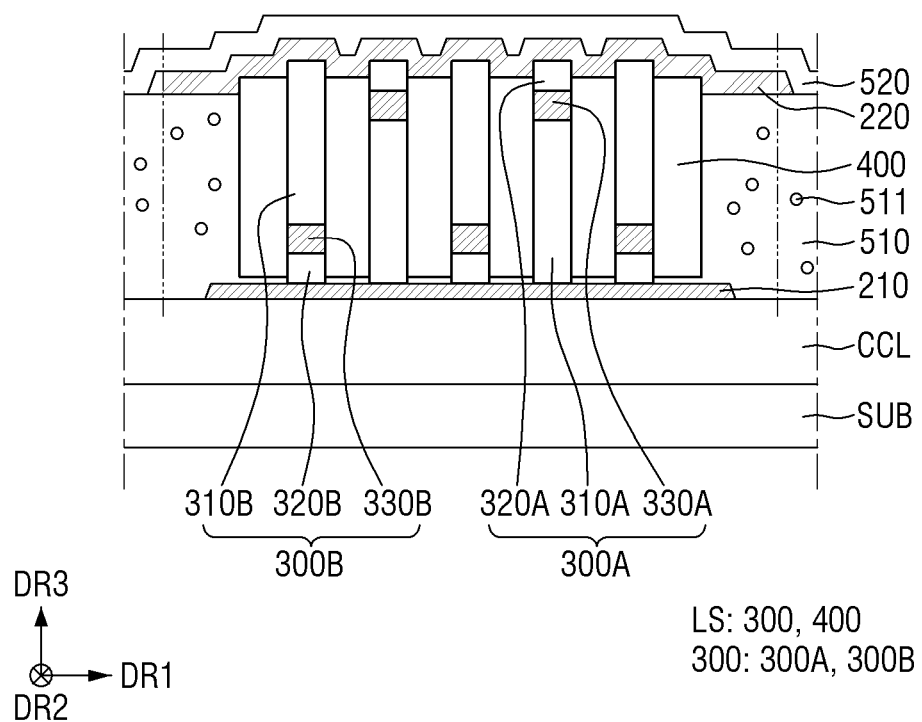
FIG. 23 is an enlarged cross-sectional view showing another embodiment of a sub-pixel of the display device shown in FIG. 14.

FIG. 23 is an enlarged cross-sectional view showing another embodiment of a sub-pixel of the display device shown in FIG. 14.

The display device according to the embodiment shown in FIG. 23 is different from the display device according to the embodiment shown in FIG. 14 in that a first insulating layer 510 further includes scatterers 511.

For example, the scatterers 511 may be dispersed in the first insulating layer 510. The scatterers 511 may have a refractive index different from that of the first insulating layer 510 and may form an optical interface with the first insulating layer 510. For example, the scatterers 511 may be light-scattering particles. The material of the scatterers 511 is not particularly limited as long as they can scatter at least some of the transmitted light. For example, the scatterers 511 may be metal oxide particles or organic particles. Examples of the metal oxide may include titanium oxide (TiO$_x$), zirconium oxide (ZrO$_x$), aluminum oxide (Al$_x$O$_y$), indium oxide (In$_x$O$_y$), zinc oxide (ZnO), tin oxide (SnO$_x$), etc. Examples of the material of the organic particles may include acrylic resin, urethane resin, etc. The scatterers 511 scatter light in random directions regardless of the direction in which the incident light is incoming and without substantially changing the wavelength of the light transmitted through the first insulating layer 510.

According to this embodiment, some of the light emitted from the second light-emitting elements 300B may be incident on the scatterers 511 included in the first insulating layer 510 and scattered by the scatterers 511. The scatterers 511 can scatter the lights emitted from the plurality of light-emitting elements 300 arranged in parallel in one direction (e.g., the third direction DR3) so that the light does not propagate in a particular direction. Accordingly, the display device 10 can emit light having a uniform density by including the scatterers 511.

Figure 24:
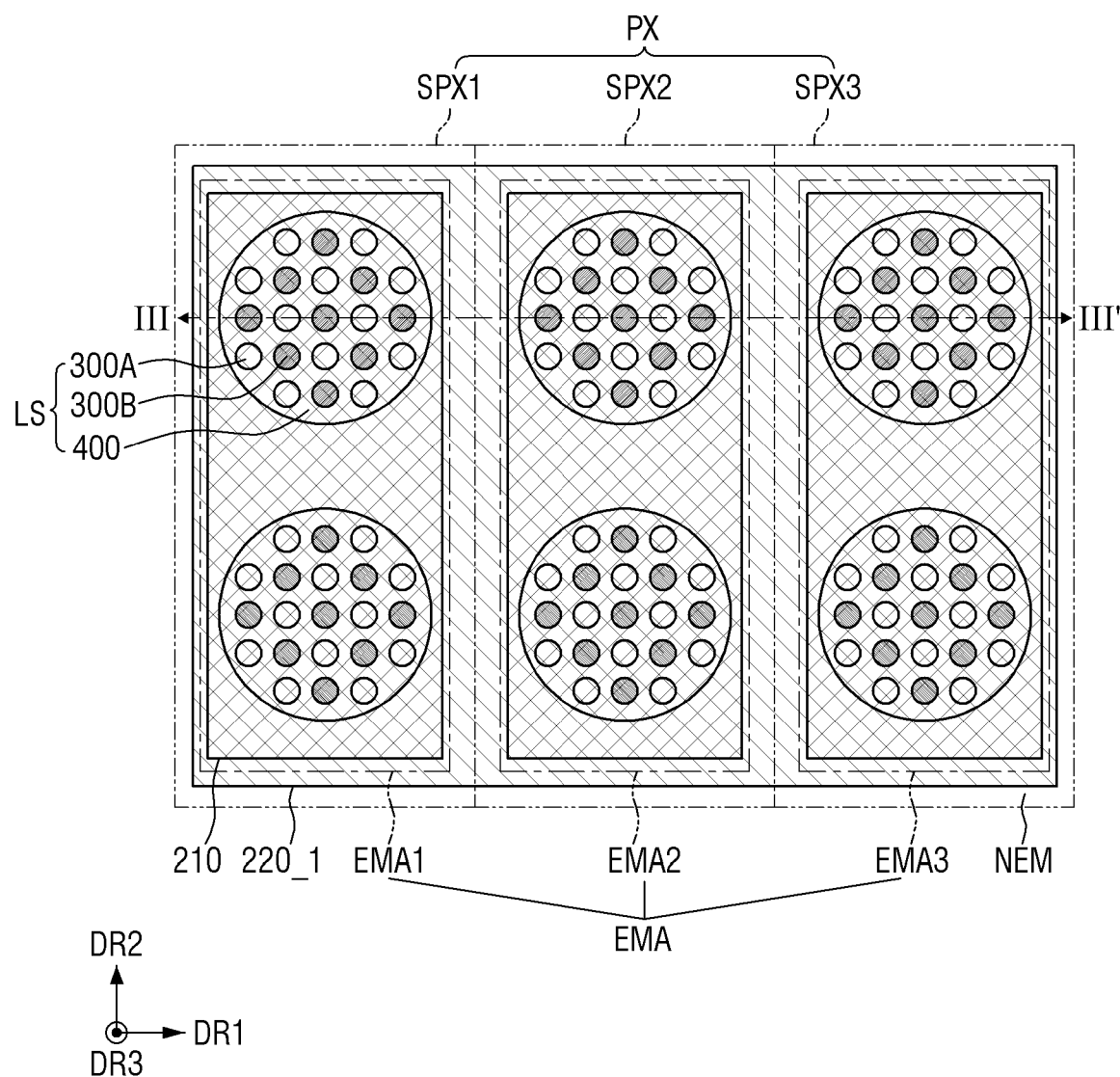
FIG. 24 is a plan view showing a pixel of a display device according to another embodiment of the present disclosure.
Figure 25:
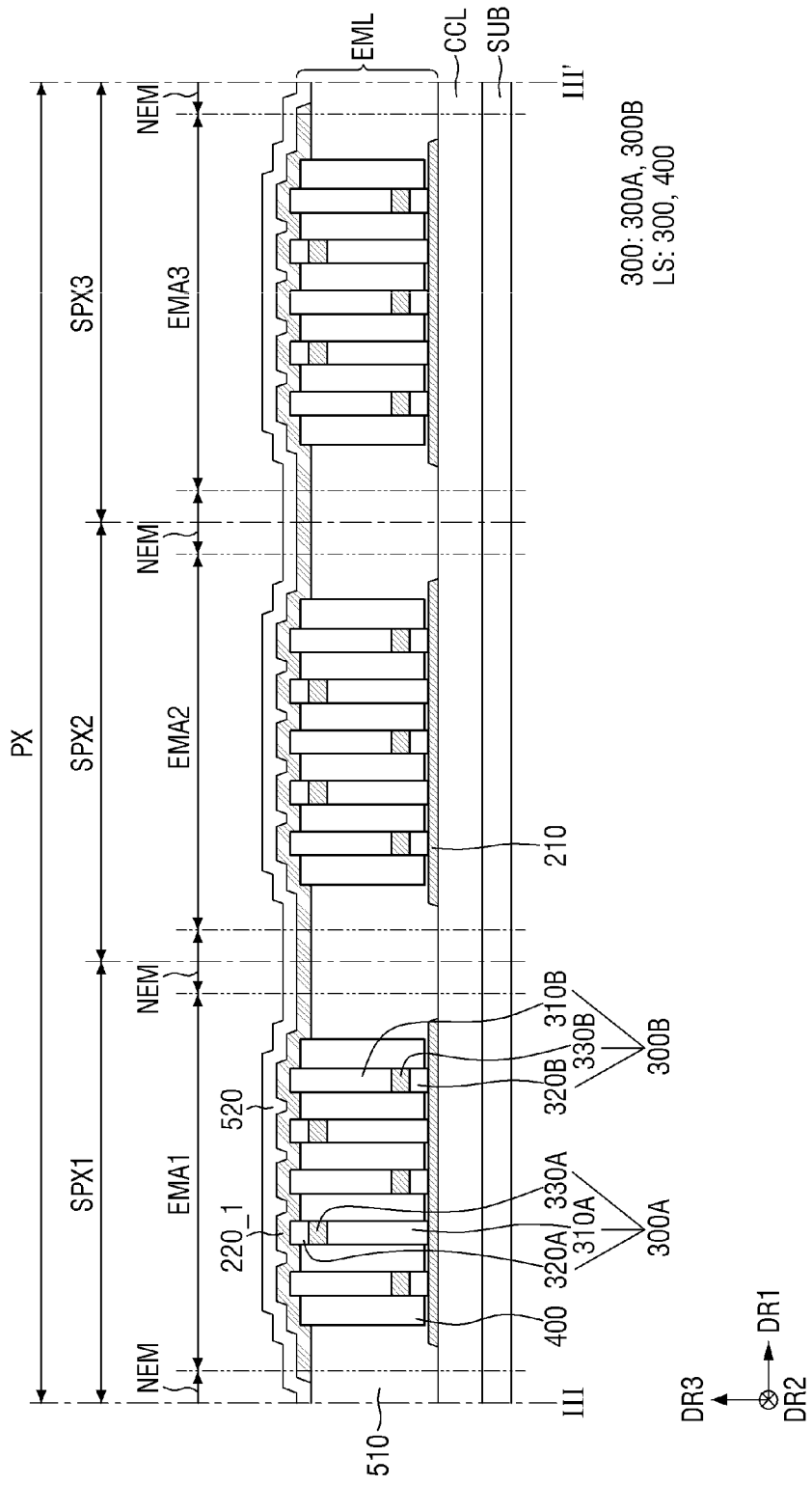
FIG. 25 is a cross-sectional view taken along the line III-III' of FIG. 24.

FIG. 24 is a plan view showing a pixel of a display device according to another embodiment of the present disclosure, and FIG. 25 is a cross-sectional view taken along the line III-III' of FIG. 24.

The display device 10 according to the embodiment shown in FIGS. 24 and 25 is different from the display device according to the embodiment shown in FIGS. 13 and 14 in that a second electrode 220_1 covers emission areas EMA of a plurality of sub-pixels SPX included in one pixel PX.

For example, the second electrode 220_1 may be a common electrode of each of the pixels PX. The second electrode 220_1 may not be separately disposed in each of the sub-pixels SPX in one pixel PX, but may be extended across the sub-pixels SPX adjacent to each other in the first direction DR1 in one pixel PX. For example, the second electrode 220_1 may be disposed to cover all of the plurality of emission areas EMA included in the sub-pixels SPX. Accordingly, the second electrode 220_1 of the sub-pixels SPX included in one pixel PX may be formed as a single piece, instead of being spaced apart from another one in the non-emission area NEM.

The area of the second electrode 220_1 may be larger than the sum of the areas of the first to third emission areas EMA1, EMA2 and EMA3. It is, however, to be understood that the present disclosure is not limited thereto. The second electrode 220_1 may be extended even across a plurality of adjacent pixels PX.

The second electrode 220_1 disposed in each pixel PX may be electrically connected to the second supply voltage line and may receive the same electric signal. According to this embodiment, the second electrode 220_1 may be disposed across the plurality of sub-pixels SPX as a single piece so that they may receive the same electric signal through the second electrode 220_1 electrically connected to the second supply voltage line.

In addition, because the second electrode 220_1 is disposed to cover the plurality of sub-pixels SPX, the second supply voltage line may be disposed only in some pixels PX or sub-pixel SPX but not in some other sub-pixels SPX. In one of the first to third sub-pixels SPX1, SPX2 and SPX3 included in one pixel PX, the second supply voltage line and a part of the second electrode 220_1 may be electrically connected with each other.

Figure 26:
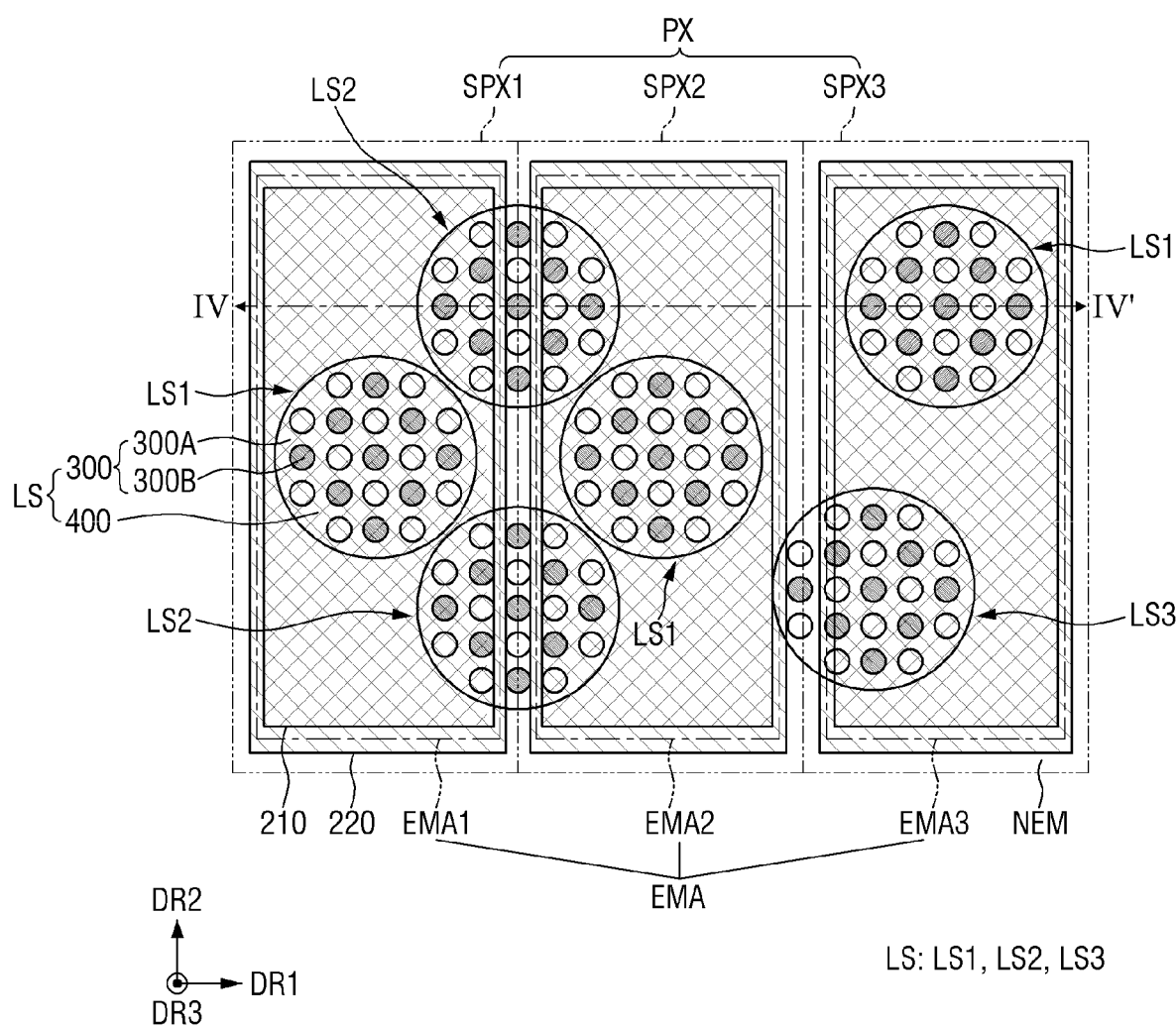
FIG. 26 is a plan view showing a pixel of a display device according to another embodiment of the present disclosure.
Figure 27:
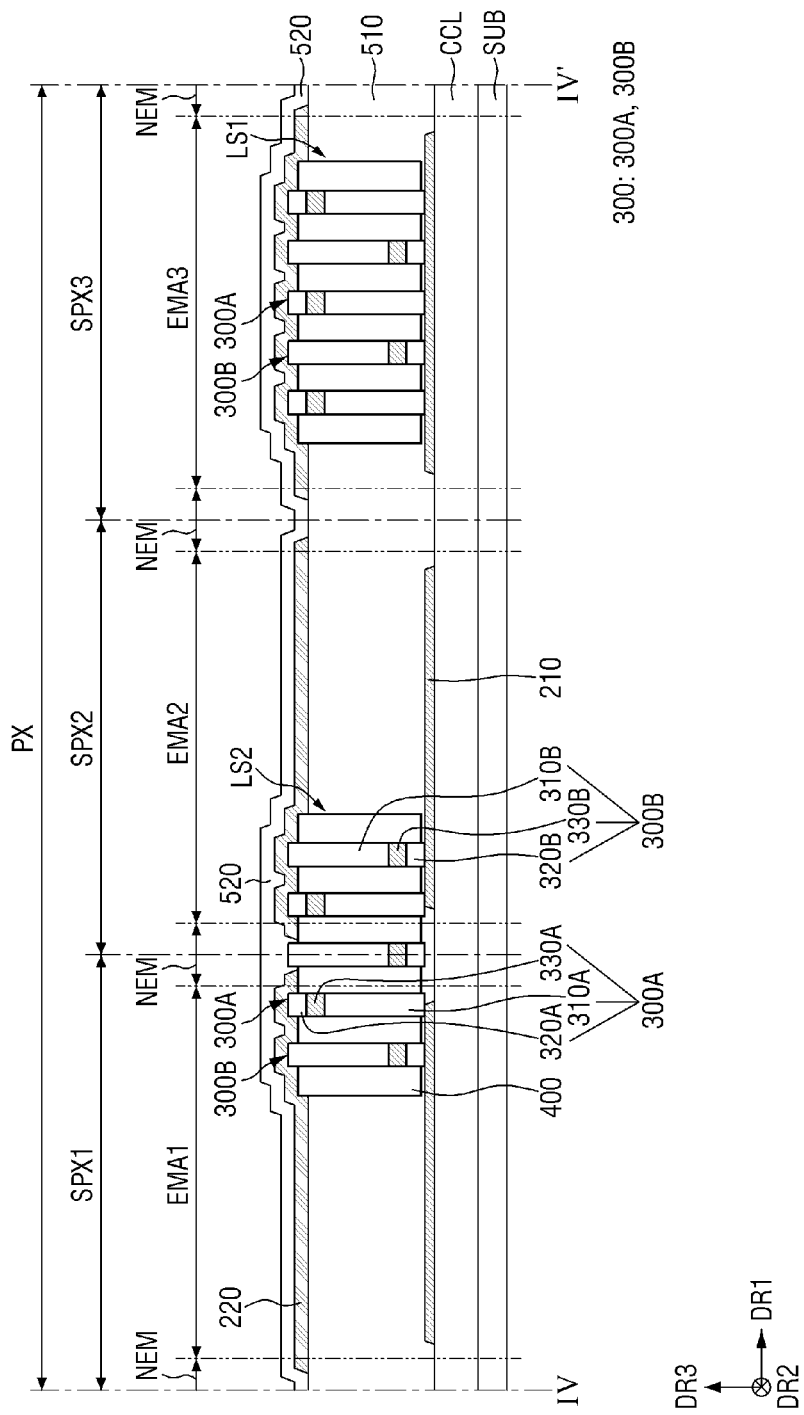
FIG. 27 is a cross-sectional view taken along the line IV-IV' of FIG. 26.

FIG. 26 is a plan view showing a pixel of a display device according to another embodiment of the present disclosure, and FIG. 27 is a cross-sectional view taken along the line IV-IV' of FIG. 26.

Referring to FIGS. 26 and 27, a plurality of units of light-emitting elements LS may include a first unit of light-emitting elements LS1, a second unit of light-emitting elements LS2, and a third unit of light-emitting elements LS3. A plurality of light-emitting elements 300 included the first unit of light-emitting elements LS1 may overlap with the first electrode 210 disposed in each of the sub-pixels SPX in the third direction DR3. The first unit of light-emitting elements LS1 may be disposed in the emission area EMA of each sub-pixel SPX to overlap the first electrode 210 and the second electrode 220 in the third direction DR3.

At least some of a plurality of light-emitting elements included in the second unit of light-emitting elements LS2 may be disposed in the non-emission area NEM, and some others thereof may be disposed on the first electrode 210 of another sub-pixel SPX spaced apart from it. For example, as shown in FIG. 26, some of the light-emitting elements 300 included in the second unit of light-emitting elements LS2 may be disposed in the non-emission area NEM between the first emission area EMA1 and the second emission area EMA2, some others thereof may be disposed in the first emission area EMA1 and may overlap the first electrode 210 of the first emission area EMA1 in the third direction, and yet others thereof may be disposed in the second emission area EMA2 to overlap the first electrode 210 of the second emission area EMA2 in the third direction.

At least some of a plurality of light-emitting elements included in the third unit of light-emitting elements LS3 may be disposed in the non-emission area NEM, and some others thereof may be disposed on the first electrode 210 of the same sub-pixel SPX spaced apart from each other. For example, as shown in FIG. 26, some of the light-emitting elements 300 included in the third unit of light-emitting elements LS3 may be disposed in the non-emission area NEM between the second emission area EMA2 and the third emission area EMA3, and some others thereof may be disposed in the third emission area EMA3 and may overlap the first electrode 210 of the third emission area EMA3 in the third direction.

In the display device according to this embodiment, the ink is ejected during the inkjet process of disposing the units of light-emitting elements LS without forming any electric field, and thus, the plurality of units of light-emitting elements LS may be arranged randomly on the substrate SUB on which the first electrode 210 is formed. However, even in this embodiment, although the light-emitting elements 300 included in the same unit of light-emitting elements LS are disposed in different sub-pixels SPX, both ends of the light-emitting elements 300 and electrically connected to the first electrode 210 and the second electrode 220 of the sub-pixels SPX, respectively, so that light can be emitted from the light-emitting elements 300.

Figure 28:
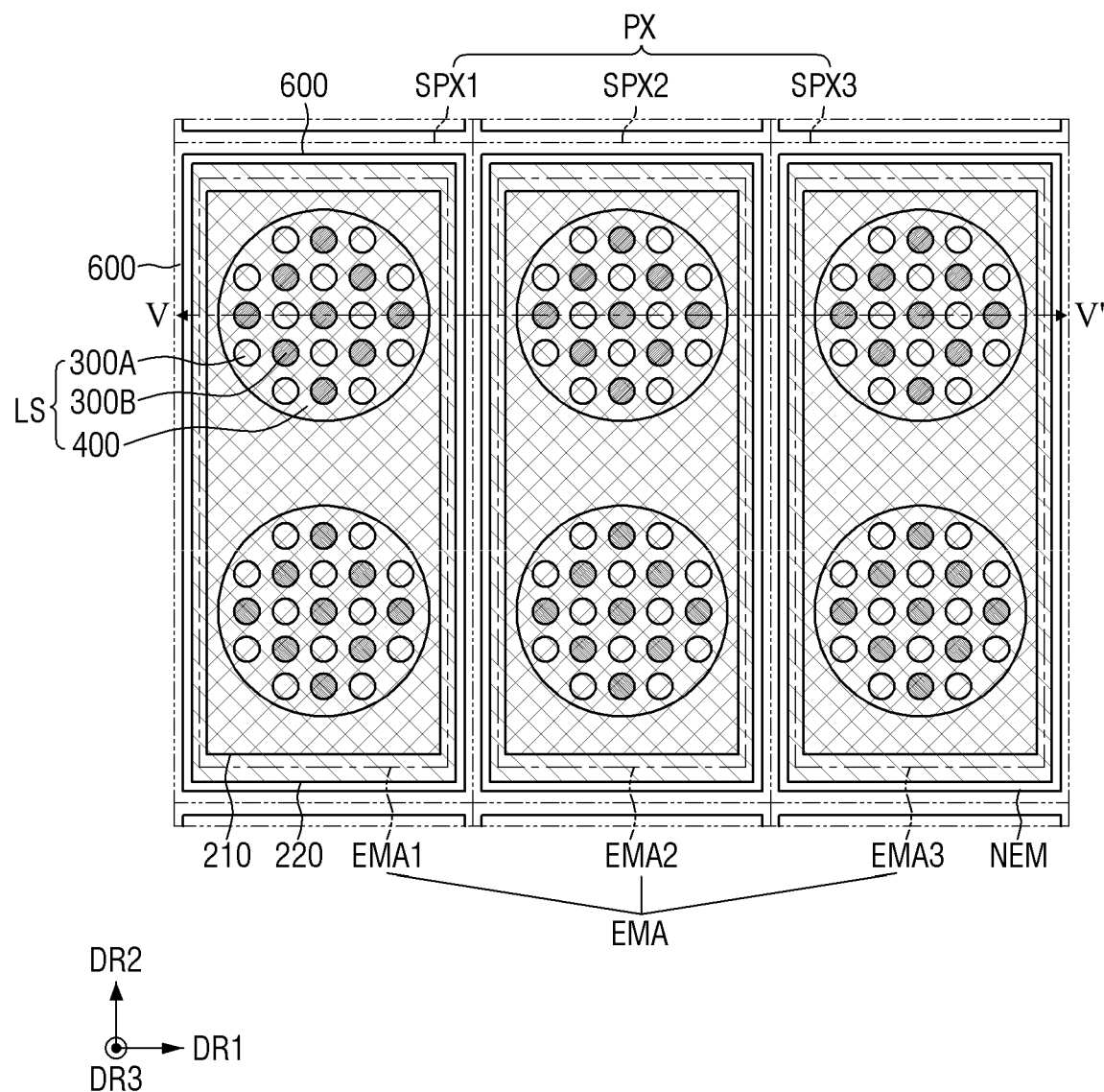
FIG. 28 is a plan view showing a pixel of a display device according to another embodiment of the present disclosure.
Figure 29:
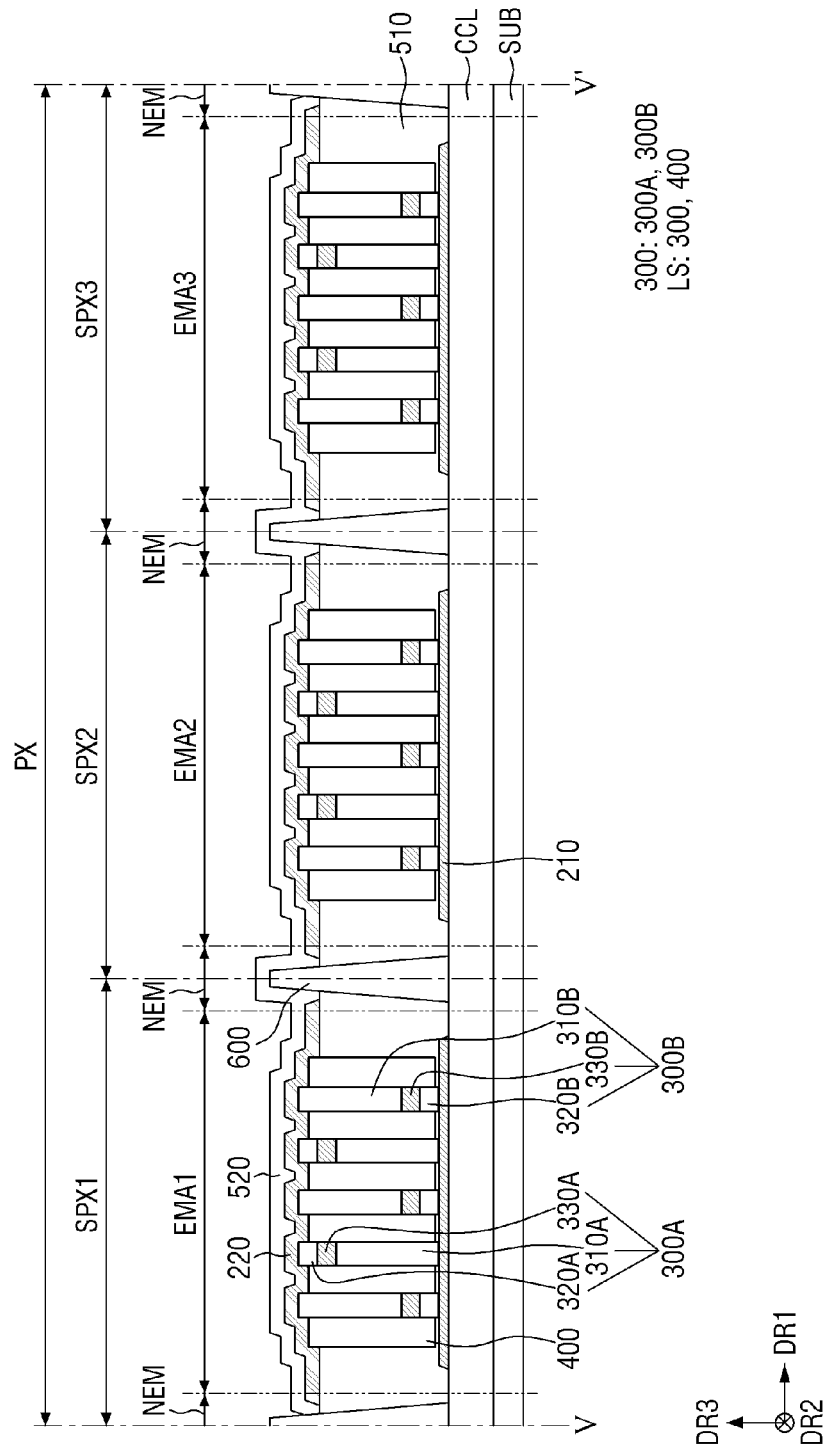
FIG. 29 is a cross-sectional view taken along the line V-V of FIG. 28.

FIG. 28 is a plan view showing a pixel of a display device according to another embodiment of the present disclosure, and FIG. 29 is a cross-sectional view showing an embodiment taken along the line V-V' of FIG. 28.

The display device 10 according to the embodiment shown in FIGS. 28 and 29 is different from the display device according to the embodiment shown in FIGS. 13 and 14 in that the display device 10 further includes a bank 600.

For example, the bank 600 may be disposed at the boundary between the sub-pixels SPX. The bank 600 may be disposed in a lattice pattern, including portions extended in the first direction DR1 and the second direction DR2 when viewed from the top. The bank 600 may prevent (or substantially prevent) the ink including the units of light-emitting elements LS from overflowing to the adjacent sub-pixels SPX and may guide the ink so that it is seated in (e.g., retained in or over) the emission area in the inkjet printing process for disposing the units of light-emitting elements LS during the process of fabricating the display device 10.

The first electrode 210, the unit of light-emitting elements LS, the first insulating layer 510, and the second electrode 220 may be disposed in the area defined by the bank 600. The bank 600 may include, but is not limited to, polyimide (PI).

The bank 600 may be disposed on the circuit layer CCL. The bank 600 may have a structure in which at least a part of the bank 600 protrudes from the circuit layer CCL. The height of the bank 600 from the upper surface of the circuit layer CCL may be greater than the height of the first insulating layer 510. In addition, the height of the bank 600 from the upper surface of the circuit layer CCL may be greater than the sum of the length of the light-emitting element 300 and the thickness of the first electrode 210.

A second insulating layer 520 may be disposed to completely cover the second electrode 220, the first insulating layer 510, and the bank 600.

According to this embodiment, the display device 10 further includes the bank 600 disposed at the boundary between the sub-pixels SPX so that the ink, in which the plurality of units of light-emitting elements LS is dispersed, can be guided to an intended location when the ink is ejected. Therefore, the ink can be guided by the bank 600 to the intended location so that it can be seated in the emission area EMA of each sub-pixel SPX. The plurality of units of light-emitting elements LS dispersed in the ink can be disposed in the emission area EMA of the sub-pixel SPX. Accordingly, as the plurality of units of light-emitting elements LS are guided to the emission area EMA, the number of light-emitting elements 300 having the first ends contacting the first electrode 210 of each sub-pixel SPX is increased so that the ratio of the light-emitting elements 300 that emit light from the units of light-emitting elements LS is increased. As a result, the amount of light emitted from each unit of light-emitting elements LS can be increased, and the display quality of the display device 10 can be improved.

Additionally, the bank 600 is disposed at the boundary between the sub-pixels SPX so that it can prevent (or substantially prevent) the ink containing the units of light-emitting elements LS from overflowing to adjacent sub-pixels SPX, and thus, it is possible to ensure that the same number of units of light-emitting elements LS are disposed in each of the sub-pixels SPX. As a result, the intensity of lights emitted from the sub-pixels SPX can be substantially uniform, and thus, the display quality of the display device 10 can be improved.

Figure 8:
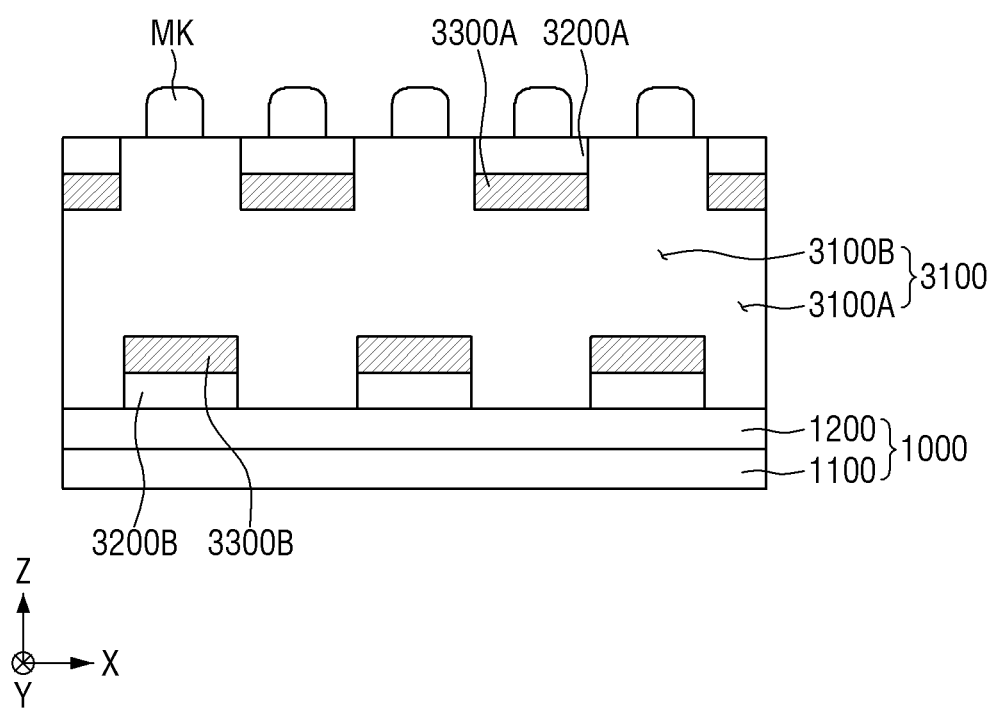
Figure 30:
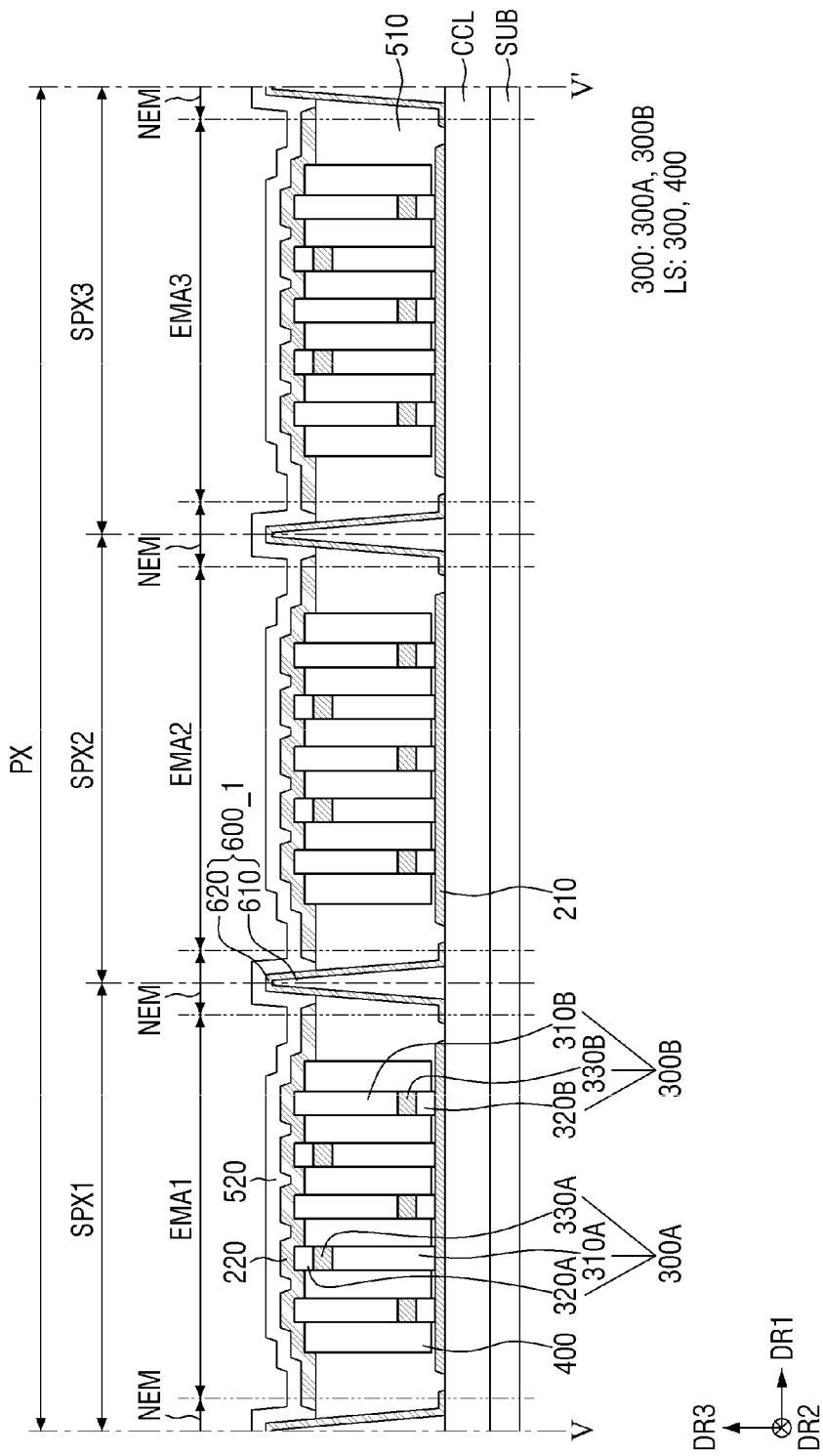
FIG. 30 is a cross-sectional view showing another embodiment taken along line the V-V' of FIG. 28.

FIG. 30 is a cross-sectional view showing another embodiment taken along the line V-V' of FIG. 8.

The display device 10 according to the embodiment shown in FIG. 30 is different from the display device according to the embodiment shown in FIG. 29 in that a bank 600_1 includes a partition wall 610 and a reflective coating layer 620.

For example, the bank 600_1 may include the partition wall 610 and the reflective coating layer 620 disposed on the partition wall 610. The partition wall 610 has substantially the same shape as the bank 600 shown in FIG. 29. The reflective coating layer 620 is disposed on the upper and side surfaces of the partition wall 610. The reflective coating layer 620 may cover the upper surface as well as the side surfaces of the partition wall 610.

The reflective coating layer 620 may include a material having high reflectance, such as metal. In an embodiment, the reflective coating layer 620 may include, but is not limited to, silver, copper, aluminum, nickel, lanthanum, an alloy thereof, indium tin oxide (ITO), indium zinc oxide (IZO), indium tin-zinc oxide (ITZO), etc. The reflective coating layer 620 may be deposited or coated directly on one surface of the partition wall 610. As another example, the reflective coating layer 620 may be attached to the partition wall 610 through an additional adhesive layer.

Some of the light traveling from the light-emitting elements 300 toward the bank 600_1 may be reflected by the reflective coating layer 620 of the bank 600_1 and may proceed toward the upper side of the substrate SUB.

Because the reflective coating layer 620 can reflect light, the partition wall 610 covered by it may include a non-reflective material or a low-reflective material. Accordingly, the bank 600_1 may be formed by forming the partition wall 610 with a material that can be easily formed, such as an organic material, and then forming the reflective coating layer 620 on the surface thereof.

According to this embodiment of the present disclosure, the bank 600_1 has a protruding structure that has a height greater than the length of the light-emitting elements 300 in the extending direction within each sub-pixel SPX and may include the reflective coating layer 620. Accordingly, the bank 600_1 can reflect light emitted from the unit of light-emitting elements LS that is directed toward the side surface of the bank 600_1 to change the traveling direction of the light to the upper side of the substrate SUB. The bank 600_1 can separate adjacent sub-pixels SPX from one another and can also act as a reflective partition wall that reflects light emitted from the unit of light-emitting elements LS. Accordingly, because the display device 10 includes the bank 600_1 including the reflective coating layer 620, the light emitted from the unit of light-emitting elements LS can proceed toward the upper side of the substrate SUB. As a result, the luminous efficiency of the display device 10 can be improved.

Figure 31:
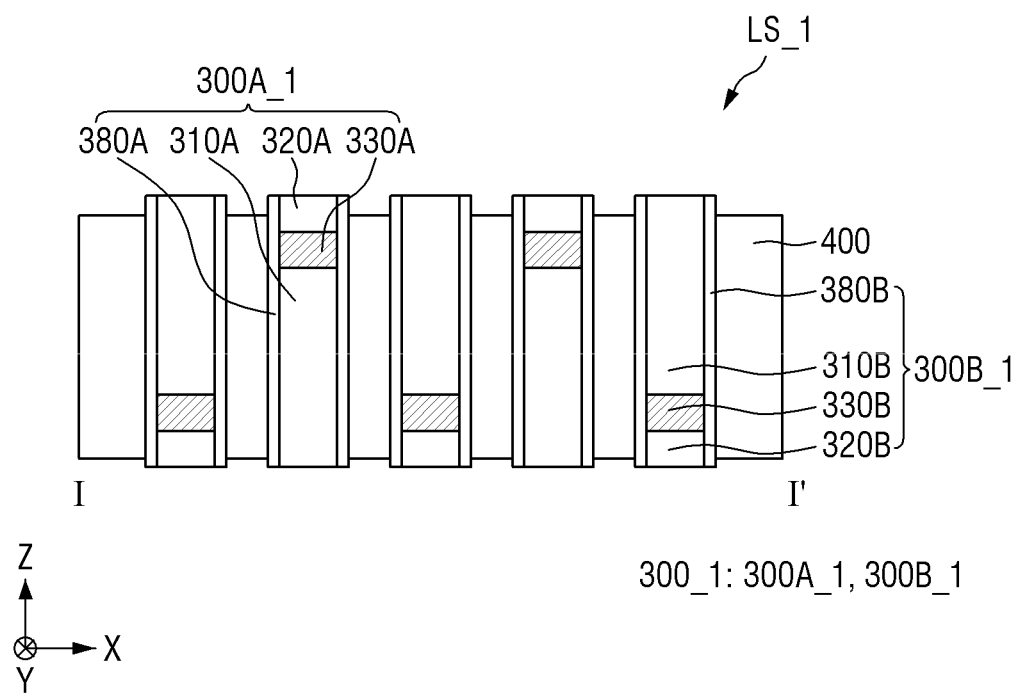
FIG. 31 is a cross-sectional view showing another embodiment taken along the line I-I' of FIG. 2.
Figure 32:
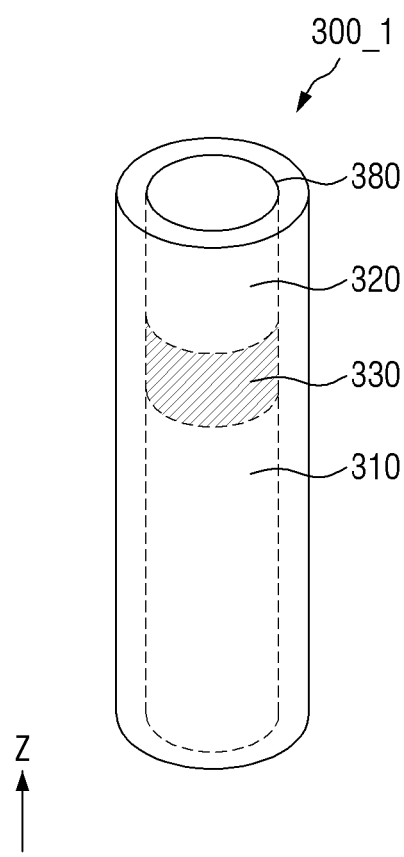
FIG. 32 is a schematic perspective view of one of the light-emitting elements shown in FIG. 31.

FIG. 31 is a cross-sectional view showing another embodiment taken along the line I-I' of FIG. 2, and FIG. 32 is a schematic perspective view of one of the light-emitting elements shown in FIG. 31.

The embodiment shown in FIGS. 31 and 32 is different from the embodiment shown in FIG. 3 in that a light-emitting element 300_1 of a unit of light-emitting elements LS_1 further includes an insulating film surrounding a first semiconductor layer, a second semiconductor layer, and an active layer.

For example, a first light-emitting element 300A_1 may further include an insulating film 380A surrounding a plurality of semiconductor layers 310A and 320A and an active layer 330A. The insulating film 380A of the first light-emitting element 300A_1 may be disposed to surround outer surfaces of the plurality of semiconductor layers 310A and 320A and the active layer 330A. The insulating film 380A of the first light-emitting element 300A_1 may be disposed to surround at least the outer surface of the active layer 330A and may be extended in the direction in which the first light-emitting element 300A_1 is extended. The insulating film 380A of the first light-emitting element 300A_1 can protect the plurality of semiconductor layers 310A and 320A and the active layer 330A.

Likewise, a second light-emitting element 300B_1 may further include an insulating film 380B surrounding a plurality of semiconductor layers 310B and 320B and an active layer 330B. The insulating film 380B of the second light-emitting element 300B_1 may be disposed to surround outer surfaces of the plurality of semiconductor layers 310B and 320B and the active layer 330B. The insulating film 380B of the second light-emitting element 300B_1 may be disposed to surround at least the outer surface of the active layer 330B and may be extended in the direction in which the second light-emitting element 300B_1 is extended. The insulating film 380B of the second light-emitting element 300B_1 can protect the plurality of semiconductor layers 310B and 320B and the active layer 330B.

Although not limited thereto, the insulating films 380A and 380B of the first light-emitting element 300A_1 and the second light-emitting element 300B_1 may be formed together via the same process.

At least a part of the outer surface of each of the insulating films 380A and 380B may contact the binder 400. The insulating films 380A and 380B may be interposed between the binder 400 and the first semiconductor layers 310A and 310B, the second semiconductor layers 320A and 320B, and the active layers 330A and 330B of the light-emitting elements 300_1, respectively. According to this embodiment, the first semiconductor layers 310A and 310B, the second semiconductor layers 320A and 320B, and the active layers 330A and 330B may be spaced apart from the binder 400. However, even in this embodiment, because the binder 400 is disposed to contact and surround the outer surfaces of the insulating films 380A and 380B, the light-emitting elements 300_1 can be fixed by the binder 400.

Although the insulating films 380A and 380B are extended in the longitudinal direction of the light-emitting elements 300_1 to completely cover from the side surfaces of the first semiconductor layers 310A and 310B to the side surfaces of the second semiconductor layers 320A and 320B in the example shown in the drawings, the present disclosure is not limited thereto. For example, the insulating films 380A and 380B may be formed to surround the side surfaces of the above-described elements, and at least one of both ends of the light-emitting elements 300_1 in the longitudinal direction may be exposed. A part of the upper surface of each of the insulating films 380A and 380B may be rounded in a cross-sectional view (e.g., may have a rounded cross section), which is adjacent to at least one end of the respective light-emitting elements 300_1.

The insulating films 380A and 380B may include materials having insulating properties, such as silicon oxide ($SiO_x$), silicon nitride ($SiN_x$), silicon oxynitride ($SiO_xN_y$), aluminum nitride (AlN) and aluminum oxide ($Al_xO_y$). Because the insulating films 380A and 380B protect the outer surfaces of the semiconductor layers including the active layers 330A and 330B, it is possible to prevent (or substantially prevent) a decrease in luminous efficiency.

The insulating films 380A and 380B may include a material having a refractive index different from that of the binder 400 from among the above-listed materials having the insulating properties. The insulating films 380A and 380B may include a material having a refractive index higher than that of the binder 400. When the insulating films 380A and 380B include the material having a higher refractive index than that of the binder 400, it is possible to prevent (or substantially prevent) light that is emitted from the outer surface of the light-emitting element 300_1 and travels toward the binder 400 from being totally reflected and, thus, unable to exit out of the light-emitting element 300_1. For example, by disposing the material having a refractive index between the refractive index of the light-emitting element 300_1 and the refractive index of the binder 400 between the light-emitting element 300_1 and the binder 400, the light emitted from the outer surface of the light-emitting element 300_1 toward the binder 400 can exit smoothly without being totally reflected.

According to this embodiment, by forming the insulating films 380A and 380B on the outer surfaces of the light-emitting elements 300_1, the insulating films 380A and 380B can protect a plurality of elements of the light-emitting elements 300_1. Accordingly, because the insulating films 380A and 380B protect the outer surfaces of the plurality of semiconductor layers and the active layer of the light-emitting element 300_1, it is possible to prevent (or substantially prevent) a decrease in luminous efficiency. In addition, when the insulating films 380A and 380B are made of the material having a refractive index higher than that of the binder 400 and lower than that of other elements included in the light-emitting elements 300_1, it is possible to prevent (or substantially prevent) total reflection, and thus, it is possible to prevent (or substantially prevent) a decrease in the luminous efficiency of the display device 10.

FIGS. 33 to 36 are cross-sectional views showing processing steps of the unit of light-emitting elements shown in FIG. 31.

Figure 33:
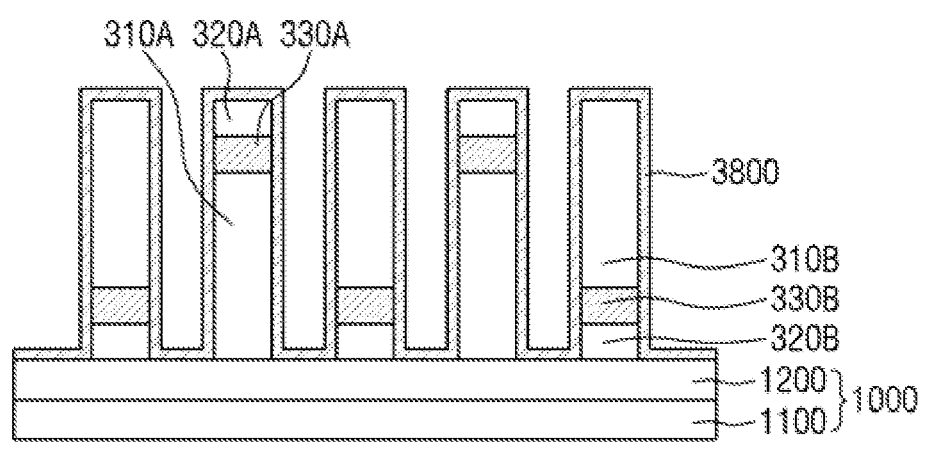
FIGS. 33 to 36 are cross-sectional views showing processing steps of the unit of light-emitting elements shown in FIG. 31.
Figure 33:
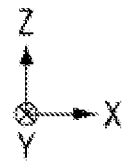

Initially, referring to FIG. 33, an insulating material layer 3800 is formed on semiconductor structures.

For example, the semiconductor structures may include a first semiconductor structure including a first semiconductor layer 310A, an active layer 330A, and a second semiconductor layer 320A sequentially stacked on one another in the z-direction Z, and a second semiconductor structure including a second semiconductor layer 320B, an active layer 330B, and a second semiconductor layer 320B sequentially stacked on one another in the z-direction Z. The insulating material layer 3800 may be formed on the entire surface of the lower substrate 1000 and may be formed on the upper surface of the buffer material layer 1200 exposed by the first and second semiconductor structures as well as the outer surfaces of the first and second semiconductor structures. The outer surfaces of the first and second semiconductor structures may include side surfaces and top surfaces of the first and second semiconductor structures. The insulating material layer 3800 may correspond to the insulating films 380A and 380A described above.

Figure 34:
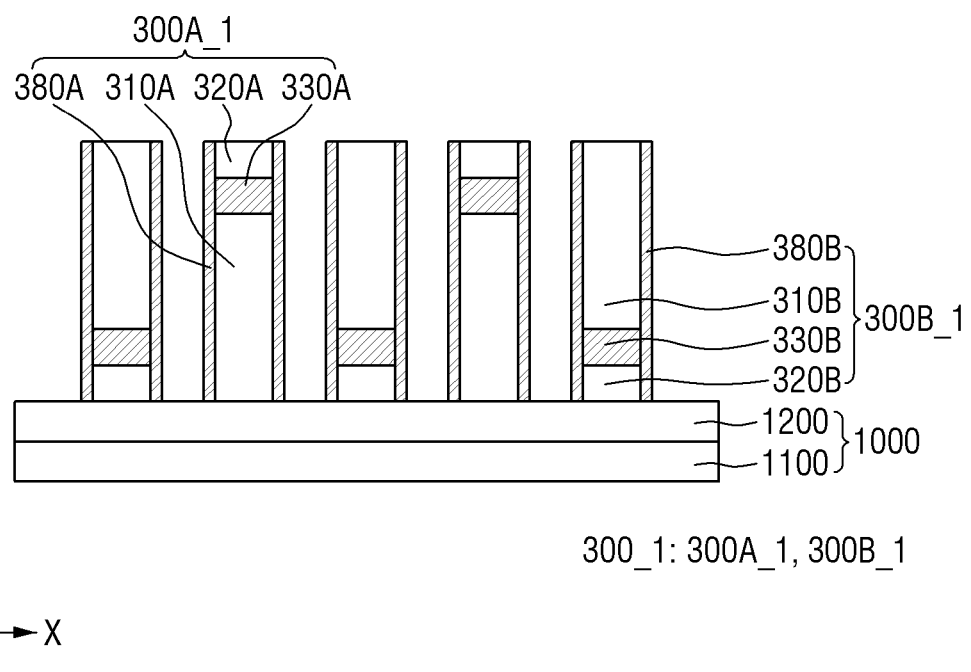

Subsequently, referring to FIG. 34, the insulating material layer 3800 is partially removed so that the light-emitting elements 300_1 including the first and second light-emitting elements 300A_1 and 300B_1 are formed.

For example, the insulating material layer 3800 may be partially removed so that the upper surfaces of the first and second semiconductor structures are exposed but the side surfaces are surrounded by the insulating material layer 3800. In this process, the insulating material layer 3800 may be partially removed to expose the upper surfaces of the first and second semiconductor structures. The process of partially removing the insulating material layer 3800 may be carried out by a process, such as a dry etching process, which is anisotropic etching, and an etch back process. During the process of partially removing the insulating material layer 3800, parts of the insulating material layer 3800 may also be removed, which are disposed on the buffer material layer 1200 exposed between the first and second semiconductor structures spaced apart from each other.

Figure 35:
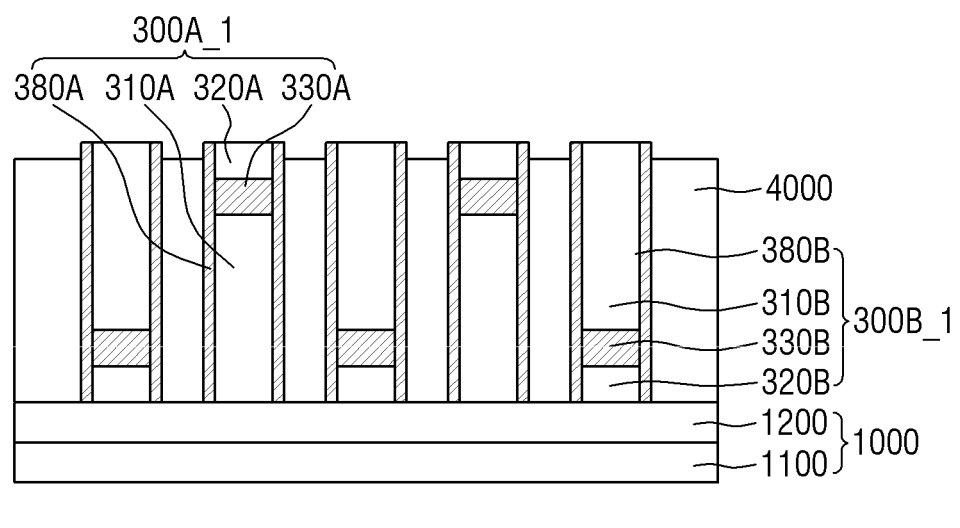
Figure 35:
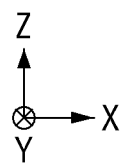

Subsequently, referring to FIG. 35, a binder material layer 4000 surrounding the outer surfaces of the plurality of light-emitting elements 300 is formed on the lower substrate 1000.

The binder material layer 4000 may be formed to surround the plurality of light-emitting elements 300_1 on the substrate 1000. The binder material layer 4000 may contact the outer surfaces of the insulating films 380A and 3806 of the first and second light-emitting elements 300A_1 and 3006_1. The binder material layer 4000 may be formed to expose the upper ends of the light-emitting elements 300_1. For example, the thickness of the binder material layer 4000 in the z-direction Z may be smaller than the length of the light-emitting elements 300_1 in the extending direction. Accordingly, the second semiconductor layer 320A located at the upper end of the first light-emitting element 300A_1 and the first semiconductor layer 3106 located at the upper end of the second light-emitting element 3006_1 may be exposed by the binder material layer 4000.

Figure 36:
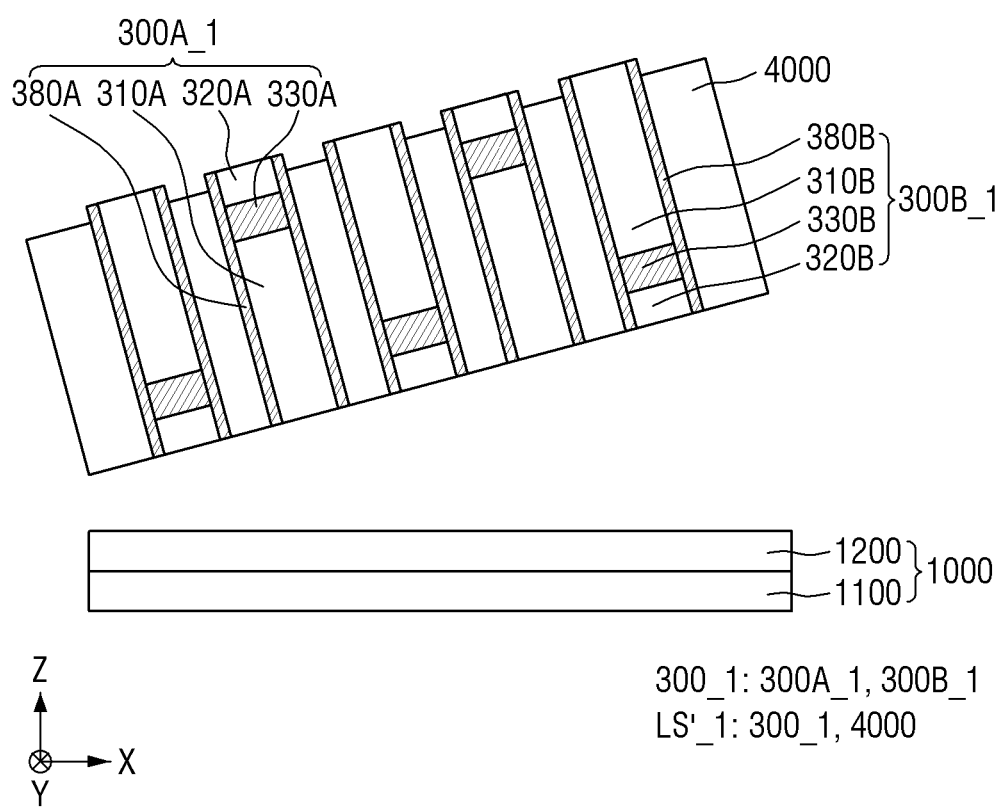

Subsequently, referring to FIG. 36, a structure of light-emitting elements LS'_1 including the plurality of light-emitting elements 300_1 and the binder material layer 4000 is separated from the lower substrate 1000.

For example, the structure of light-emitting elements LS'_1 may include the first and second light-emitting elements 300A_1 and 3006_1 including insulating films 380A and 380B, respectively, and the binder material layer 4000. A method of separating the structure of light-emitting elements LS'_1 from the lower substrate 1000 during the process of fabricating the structure of light-emitting elements LS_1 is not particularly limited. The process of separating the light-emitting element structure LS'_1 from the lower substrate 1000 may be performed by a physical separation method or a chemical separation method. The lower surface of the binder material layer 4000 and the lower surfaces of the light-emitting elements 300A_1 and 3006_1 may be disposed in the same plane. Subsequently, the thickness of the binder material layer 4000 is reduced due to deterioration or curing so that the binder material layer 4000 may be formed into the binder 400 exposing both ends of the light-emitting elements 300_1 as shown in FIG. 31.

Figure 37:
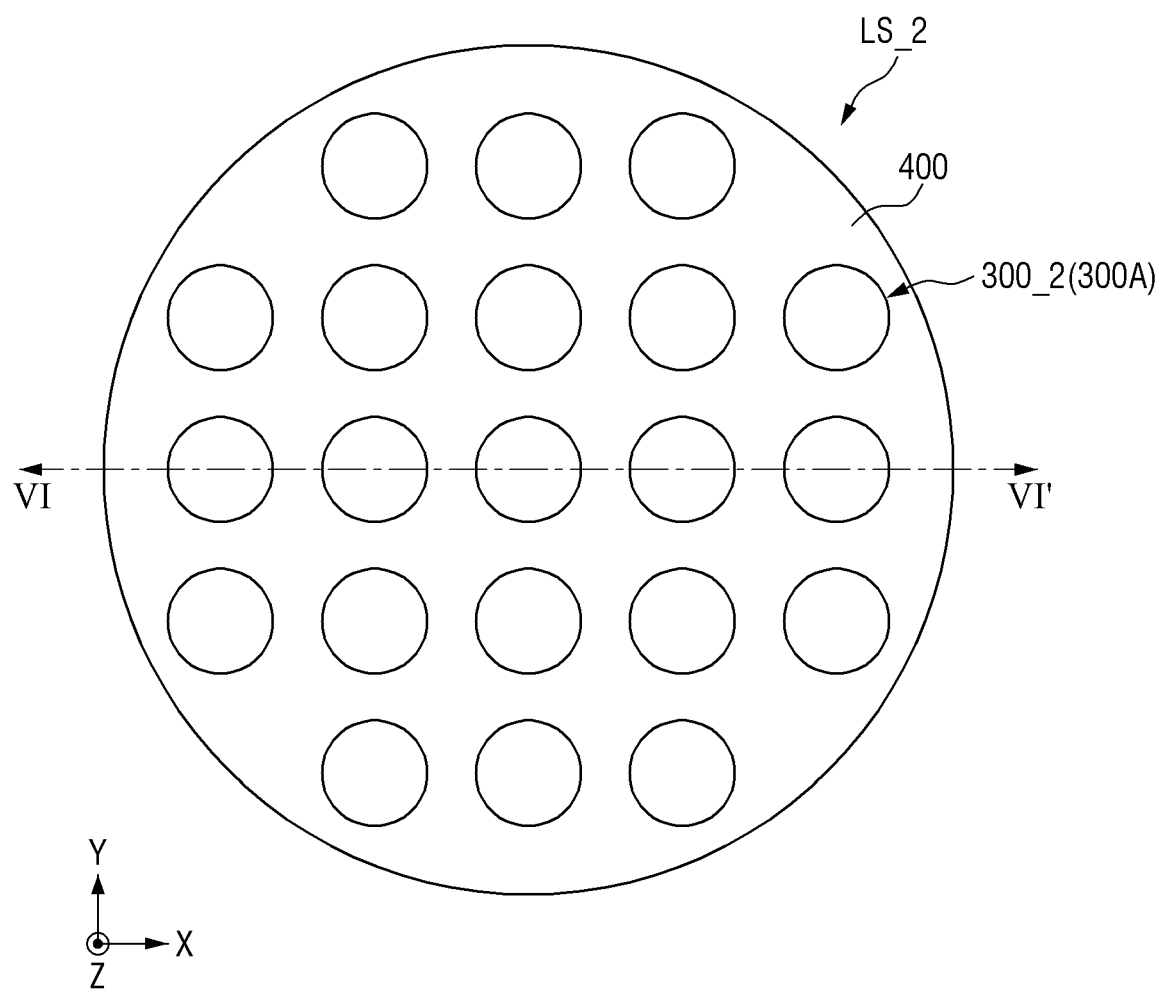
FIG. 37 is a plan view of a unit of light-emitting elements according to another embodiment of the present disclosure.
Figure 38:
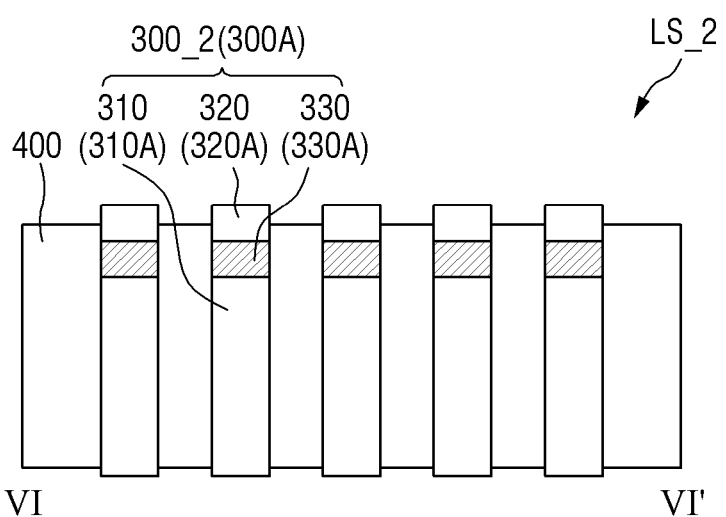
FIG. 38 is a cross-sectional view taken along the line VI-VI' of FIG. 37.

FIG. 37 is a plan view of a unit of light-emitting elements according to another embodiment of the present disclosure, and FIG. 38 is a cross-sectional view showing an embodiment taken along the line VI-VI' of FIG. 37.

A unit of light-emitting elements LS_2 according to the embodiment shown in FIGS. 37 and 38 is different from the unit of light-emitting elements LS shown in FIGS. 2 and 3 in that multiple layers included in a plurality of light-emitting elements 300_2 have the same stacking direction.

For example, the unit of light-emitting elements LS_2 may include a plurality of light-emitting elements 300_2 and a binder 400 formed to surround and the plurality of light-emitting elements 300_2 and fixing the plurality of light-emitting elements 300_2. Each of the light-emitting elements 300_2 may have a shape extended in the z-direction Z, and the light-emitting elements 300_2 may be spaced apart from one another in the x-direction X and/or the y-direction Y perpendicular to the z-direction Z.

Each of the light-emitting elements 300_2 may include a first semiconductor layer 310, a second semiconductor layer 320, and an active layer 330 disposed between the first semiconductor layer 310 and the second semiconductor layer 320. According to this embodiment of the present disclosure, each of the light-emitting elements 300_2 included in the unit of light-emitting elements LS_2 may include the first semiconductor layer 310, the active layer 330, and the second semiconductor layer 320 sequentially stacked on one another in the z-direction Z. For example, the multiple layers included in the plurality of light-emitting elements 300_2 of the unit of light-emitting elements LS_2 may be stacked in the same direction. Herein, the same stacking direction indicates that the type of the semiconductor layers of the light-emitting elements 300_2 at the upper end (the end on one side of the z-direction) are all the same, and the type of the semiconductor layers of the light-emitting elements 300_2 at the lower end (the end on the opposite side of the z-direction) are all the same. For example, the second semiconductor layers 320 may be located at the upper end (the end on the side of the z-direction Z) of the light-emitting elements 300_2 included in the unit of light-emitting elements LS_2, and the first semiconductor layers 310 may be located at the lower end (the end on the opposite side in the z-direction Z) of the light-emitting elements 300_2.

According to this embodiment, the patterning process for different stacking directions may be eliminated from the process of fabricating the unit of light-emitting elements LS_2. For example, because the unit of light-emitting elements LS_2 according to this embodiment includes the plurality of light-emitting elements 300_2 having the same stacking direction, the patterning process for different stacking directions may be eliminated from the process of fabricating the unit of light-emitting elements LS including the first and second light-emitting elements 300A and 300B having different stacking directions, as described above with reference to FIGS. 2 and 3. Accordingly, as the unit of light-emitting elements LS_2 according to this embodiment includes the light-emitting elements 300_2 in which the multiple layers are stacked in the same direction, the efficiency of process of fabricating the unit of light-emitting elements LS_2 can be improved.

In concluding the detailed description, those skilled in the art will appreciate that many variations and modifications can be made to the embodiments described herein without substantially departing from the aspects and features of the present disclosure. Therefore, the disclosed embodiments of the disclosure are used in a generic and descriptive sense and not for purposes of limitation.

What is claimed is:

1. A display device comprising:
   a substrate;
   a first electrode on the substrate;
   a second electrode above the first electrode and spaced apart from the first electrode in a thickness direction of the substrate; and
   a first unit of light-emitting elements and a second unit of light-emitting elements spaced apart from the first unit of light-emitting elements, the first and second units of light-emitting elements being between the first electrode and the second electrode,
   wherein each of the first and second units unit of light-emitting elements comprises:
      a plurality of light-emitting elements having a shape extended in a first direction and spaced apart from one another in a second direction perpendicular to the first direction, and
      a binder extending around a periphery of the plurality of light-emitting elements and fixing the plurality of light-emitting elements,
   wherein each of the plurality of light-emitting elements comprises a first semiconductor layer having one of an n-type or p-type conductivity, a second semiconductor layer having the other of the n-type or p-type conductivity, and an active layer between the first semiconductor layer and the second semiconductor layer,
   wherein the plurality of light-emitting elements comprises:
      a plurality of first light-emitting elements in which the first semiconductor layer, the active layer, and the second semiconductor layer are arranged along the first direction in this order, and
      a plurality of second light-emitting elements in which the second semiconductor layer, the active layer, and the first semiconductor layer are arranged along the first direction in this order,
   wherein the number of the plurality of first light-emitting elements is the same as the number of the plurality of second light-emitting elements in each of the first and second units of light-emitting elements, and
   wherein the plurality of light-emitting elements in the first unit of light-emitting elements overlaps with the first electrode, and
   wherein a first group of light-emitting elements from among the plurality of light-emitting elements in the second unit of light-emitting elements overlap with the first electrode and a second group of the light-emitting elements from among the plurality of light-emitting elements in the second unit of light-emitting elements do not overlap with the first electrode.

2. The display device of claim 1, wherein the first direction and the thickness direction of the substrate are parallel to each other.

3. The display device of claim 1, wherein each of the light-emitting elements in the first unit of light-emitting elements and in the first group of light-emitting elements has a first end electrically connected to the first electrode and a second end electrically connected to the second electrode.

4. The display device of claim 3, wherein the first end of each of the light-emitting elements is at a lower end thereof along the first direction, and
wherein the second end of each of the light-emitting elements is at an upper end thereof along the first direction.

5. The display device of claim 4, wherein the first end of each of the light-emitting elements in the first unit of light-emitting elements and in the first group of light-emitting elements contacts the first electrode, and the second end of each of the light-emitting elements in the first unit of light-emitting elements and in the first group of light-emitting elements contacts the second electrode.

6. The display device of claim 3, further comprising a first insulating layer extending around at least one area of a periphery of the first and second units unit of light-emitting elements and on the first electrode,
wherein the second electrode is on the first insulating layer.

7. The display device of claim 6, wherein the first insulating layer exposes the second end of each of the light-emitting elements.

8. The display device of claim 1, wherein a thickness of the binder in the first direction is smaller than a length of the light-emitting elements in the first direction.

9. The display device of claim 8, wherein the binder exposes both ends of each of the light-emitting elements.

10. The display device of claim 9, wherein the first light-emitting element and the second light-emitting element are alternately arranged along the second direction.

11. The display device of claim 1, wherein the second electrode overlaps the first electrode in the thickness direction of the substrate.

12. The display device of claim 1, wherein at least one light-emitting element in the second group of light-emitting elements in the second unit of light-emitting elements has both ends thereof not electrically connected to the first electrode and the second electrode.

* * * * *